United States Patent
Ogure et al.

(10) Patent No.: US 6,921,722 B2
(45) Date of Patent: Jul. 26, 2005

(54) COATING, MODIFICATION AND ETCHING OF SUBSTRATE SURFACE WITH PARTICLE BEAM IRRADIATION OF THE SAME

(75) Inventors: Naoaki Ogure, Tokyo (JP); Kuniaki Horie, Kanagawa (JP); Yuji Araki, Kanagawa (JP); Hiroshi Nagasaka, Kanagawa (JP); Momoko Kakutani, Tokyo (JP); Tohru Satake, Kanagawa (JP)

(73) Assignee: Ebara Corporation, Tokyo (JP)

( * ) Notice: Subject to any disclaimer, the term of this patent is extended or adjusted under 35 U.S.C. 154(b) by 358 days.

(21) Appl. No.: 09/866,843

(22) Filed: May 30, 2001

(65) Prior Publication Data

US 2001/0055649 A1 Dec. 27, 2001

(30) Foreign Application Priority Data

| May 30, 2000 | (JP) | ..... | 2000/160076 |
| Aug. 25, 2000 | (JP) | ..... | 2000/254790 |
| Aug. 29, 2000 | (JP) | ..... | 2000/259459 |
| Dec. 5, 2000 | (JP) | ..... | 2000/370601 |

(51) Int. Cl.$^7$ ................................. H01L 21/302
(52) U.S. Cl. .............. 438/708; 438/711; 438/712; 216/65; 216/66; 216/71; 427/569; 427/596
(58) Field of Search ............... 134/1.2; 156/345.38, 156/345.39, 345.4, 345.43, 345.47, 345.5, 345.55; 216/65, 66, 71; 438/711, 712, 708, 709, 714, 729; 427/596, 569

(56) References Cited

U.S. PATENT DOCUMENTS

| 5,395,474 A | * | 3/1995 | Suzuki et al. ........ 156/345.31 |
| 5,563,416 A | * | 10/1996 | Hatakeyama ........... 250/492.1 |
| 5,677,011 A | * | 10/1997 | Hatakeyama et al. ...... 427/497 |
| 5,708,267 A | * | 1/1998 | Hatakeyama ............. 250/251 |
| 5,827,786 A | * | 10/1998 | Puretz ..................... 438/789 |
| 5,868,952 A | * | 2/1999 | Hatakeyama et al. ........ 216/66 |
| 5,883,470 A | * | 3/1999 | Hatakeyama et al. .... 315/111.5 |
| 6,641,705 B2 | * | 11/2003 | Phaneuf et al. ........ 204/192.34 |
| 2001/0045525 A1 | * | 11/2001 | Gerlach et al. .......... 250/492.1 |

FOREIGN PATENT DOCUMENTS

JP 08-255698 * 10/1996

OTHER PUBLICATIONS

"Digital Chemical Vapor Deposition And Etching Technologies For Semiconductor Processing"; Horiike et. al.; Journal of Vacuum Science and Technology, Part A; 8 (3); 5–1990'; □□pp. 1844–1850.*

"Neutral–Beam–Assisted Etching of Silicon Dioxide–a Charge Free Etching Process"; □□Japanese Journal of Applied Physics; Part 1: Regular Papers, Short Notes & Review Papers (1990'); 29(10); Mizutani et. al.; abstract only.*

"High Vacuum Versus "Enviromental" Electron Beam Deposition"; Journal of Vacuum Science and Technology; (1996); 14(4); pp 2609–2614; Foleh et al.*

* cited by examiner

Primary Examiner—George A. Goudreau
(74) Attorney, Agent, or Firm—Wenderoth, Lind & Ponack, L.L.P.

(57) ABSTRACT

There is provided a method of performing a surface treatment, such as coating, denaturation, modification and etching, on a surface of a substrate. The method comprises the steps of bringing a surface treatment gas into contact with a surface of a substrate, and irradiating the surface of the substrate with a fast particle beam to enhance an activity of the surface and/or the surface treatment gas, thereby facilitating a reaction between the surface and the gas. The fast particle beam may be selected from a group consisting of an electron beam, a charged particle beam, an atomic beam and molecular beam. For example, during a coating operation, chemical deposition of predetermined component elements of the gas onto the surface is effected and a predetermined portion of the surface of the substrate is irradiated with a particle beam to form a coating layer on the predetermined portion.

24 Claims, 35 Drawing Sheets

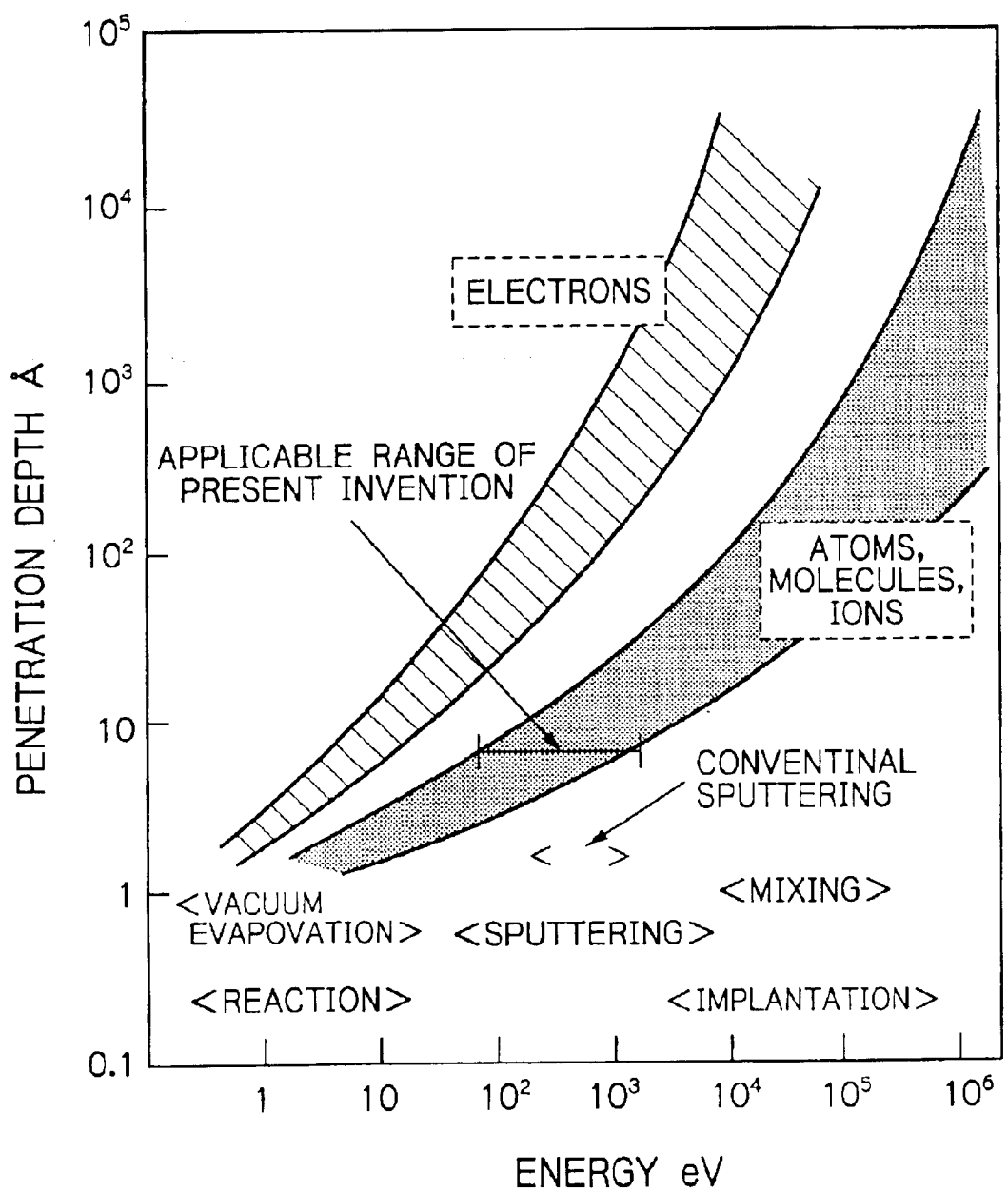

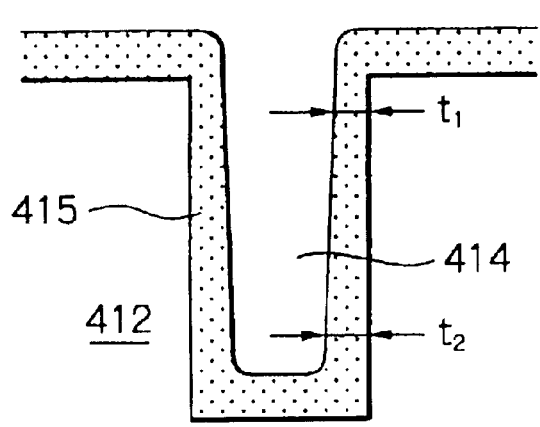
FIG. 27 (a)
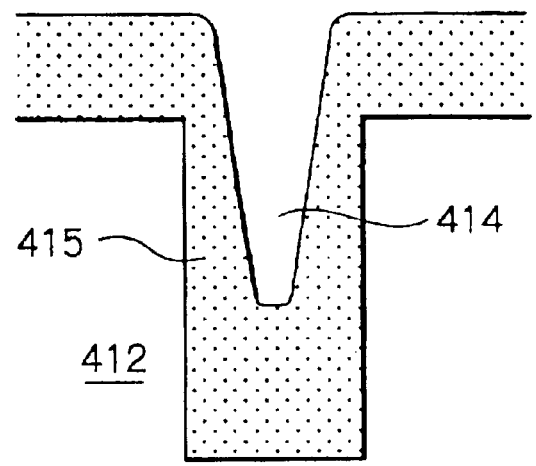
FIG. 27 (b)
*Fig. 28*
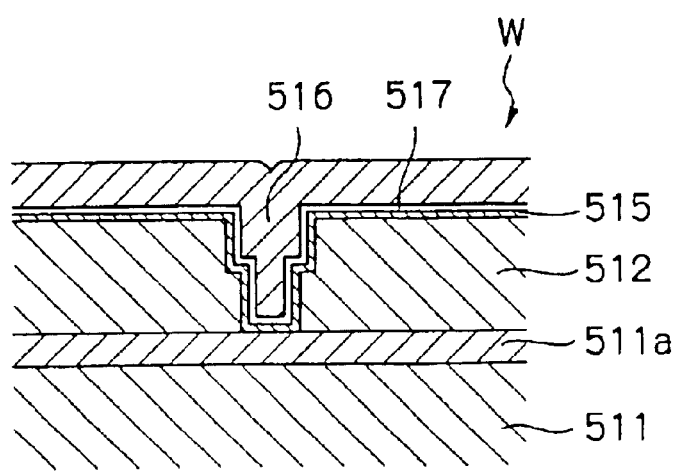

| ETCHING GAS | H(hfac)+O$_2$ | H(hfac) |
|---|---|---|
| PARTICLE BEAM | ARGON ION OR ARGON RADICAL | OXYGEN ION OR OXYGEN RADICAL |

ION BEAM

NEUTRAL PARTICLE BEAM

COATING, MODIFICATION AND ETCHING OF SUBSTRATE SURFACE WITH PARTICLE BEAM IRRADIATION OF THE SAME

BACKGROUND OF THE INVENTION

The present invention relates to a surface treatment technology including coating, modification and etching of a surface of a substrate (such as a semiconductor wafer), in particular, to a surface treatment technology using various kinds of beams, such as particle beams, for facilitating reaction of the surface to a source material used in the surface treatment.

With rapid achievement of finer and even more densely packed semiconductor devices, an interconnect (or circuit wiring) pitch has become markedly narrow, and an interconnect electric density has increased considerably. As a result, conventional semiconductor devices comprising an interlayer insulative film layer of silicon oxide and an aluminum-based conductor are confronted with serious problems, i.e. an RC delay phenomenon in signal transmission (i.e. a delay relating to electrical resistance and static capacitance) and electro-migration damage to conductor material. To solve such a problem, it has recently been considered to be essential for conductor material to be changed from presently used aluminum-based material to copper, which has lower electrical resistivity. Further, a coating technology referred to as "chemical vapor deposition (CVD)" has been considered to be most suitable for fabricating such copper interconnects (for example, see NIKKEI MICRODEVICE, December 1998, p.32).

FIG. 1 is a schematic diagram illustrating an exemplary configuration of a coating apparatus used for copper-coating by CVD technology. In FIG. 1, reference numeral 1 designates a reaction chamber which has a susceptor 2 arranged therein for loading a substrate Wf thereon, and is connected to a vacuum evacuation system such as a vacuum pump or the like so as to be decompressed to a specified value P. Reference numeral 3 designates a source material container for containing a source liquid, from which the source liquid is sent to a vaporizer 5 (at a flow rate f) by supplying a carrier gas from a carrier gas container 4 to the source material container 3, so as to be vaporized therein and supplied into the reaction chamber I as a source gas 6. Further, the susceptor 2 is equipped with a heater 7 therein for heating the semiconductor substrate Wf.

In the coating apparatus with a configuration described above, after an inner pressure of the reaction chamber I having been reduced to a predetermined pressure P, the source gas 6 is introduced thereinto from the vaporizer 5 so as for copper included in the source gas to be dissociated and deposited onto a surface of the substrate Wf. As for the source material, an organic complex containing Cu as a component (e.g. hexafluoroacetylacetunate-Cu(I)-trimethylvinyl-silane, liquid under ordinary temperature) is mainly used to be vaporized in the vaporizer 5, and the substrate Wf is heated up to 140 to 180° C. to cause a reaction so that the copper may be deposited on the surface of the substrate Wf, having recesses such as fine via holes and trenches formed therein, for forming an interconnect in a semiconductor device.

FIGS. 2(a) and 2(b) are schematic cross sectional views of a recess, respectively illustrating typical conditions of deposition of copper: 1) coating; and 2) filling thereof. FIG. 2(a) shows a case of coating, in which a diffusion barrier 13 is formed on a surface of a fine recess 12 formed in an insulating layer 11 of a substrate, and a deposited copper layer 14 is formed on the diffusion barrier 13 as a seed layer. FIG. 2(b) shows a case of filling, in which the coating as shown in FIG. 2(a) further proceeds and, as a result, the recess of the surface is finally filled with copper to form a copper layer 15 over the surface with the recess.

As described above, various problems are likely to occur when fine recesses in a surface of a substrate are actually coated or filled with copper by CVD technology. That is, coating or filling the fine recess, with a width equal to or narrower than 0.13 $\mu$m, with metal copper by ordinary CVD causes problems such as 1), as shown in FIG. 3(a), a surface of a formed coating film has considerable roughness (bad morphology), and 2), as shown in FIG. 3(b), a defect such as a void or seam is also likely to be produced in copper filled into the recess due to a premature flow-choking forming in an inlet port or mouth of the recess prior to completely filling an interior thereof.

A reason why this phenomenon occurs is considered to be that a trend for a small number of nucleation sites to grow to an abnormally great size is dominant since an activity on a surface of an under-layer is inherently low, and thereby a density of a nucleation site of metal precipitation is made to be extremely low.

As time passes, an island-like deposited copper layer 14 shown in FIG. 3(a) grows in thickness and volume such that each island coalesces with another one to eventually form a continuous film-like deposition, but since density of a nucleation site is low and a number of generated islands is small, the deposited copper layer formed after a certain period of time has a considerable rough surface, which presents an undesirable morphology.

A major reason why the void defect 16, as shown in FIG. 3(b), occurs in the recess 12 is considered to be that in the course of the filling process, the deposited copper layer 15 grows locally at an inlet port of the recess so as to be protruded from each side thereof to bridge the inlet port, and thereby copper is prevented from flowing into the recess.

Since Cu-CVD is typically performed under a pressure of several Torrs to several tens of Torrs, a fluidity of a gaseous phase is under a condition of viscous flow. Accordingly, a source component reaches a surface of a substrate via diffusion passing through a stagnant layer existing near the substrate. A steep gradient in a source concentration generated in the stagnant layer is thought to have a certain relationship with choking of the inlet port.

A deposition rate of copper by CVD has been generally known to be fairly slow in comparison with that of sputter reflow, electroplating or the like.

Indeed, the former hardly exceeds a deposition rate of 200 nm/min, while the latter two easily accomplish a deposition rate of approximately 500 nm/min.

Further, because bonding strength between a copper deposition layer formed by CVD and a substrate surface (surface of the diffusion barrier 13, for example, surface of TaN film) is small, there is a danger that electro-migration resistance might deteriorate. A poor adhesive bonding property as described above is considered to arise from the fact that a lattice incoherence exists between TaN and Cu, and that a surface of a TaN layer formed on the surface of the substrate by conventional sputtering is then oxidized in a surrounding environment so as to be covered by anoxide film.

In connection with this, in order to solve the problem of the RC delay phenomenon in signal transmission and electromigration damage to conductor material, there has been suggested a change of material of an interlayer insulative film layer from the presently used silicon oxide to an organic material having a low dielectric constant, in addition to the above-discussed proposal to change the conductor material to copper. However, even if a diffusion barrier layer of a metal or a compound is deposited in contact with an interlayer insulative film layer of an organic material, a favorable adhesion (bond) strength cannot be obtained by a conventional practice because there is a large difference in properties between materials of these two layers. Accordingly, the diffusion barrier layer is likely to peel or become loose by receiving a thermal or mechanical load after a deposition process. Thus, the conventional practice has a serious problem to be solved.

Organic materials usable in the near future to form an interlayer insulative film layer include siloxane-based organic materials. A typical example thereof is MSQ (Methyl SilsesQuioxane), which is an organic SOD having a methyl group. Examples of pure materials containing no siloxane are organic polymers (e.g. polyaryl ether and aromatic hydrocarbons). These organic materials have a dielectric constant on the order of 2.5 and are therefore considered to be most probable materials for next-generation interconnect structures (see, for example, the August 1999 issue of Electronic Journal, p. 91).

Such an organic material and a metal or compound material commonly used to form a diffusion barrier layer in contact with the organic material are substantially different from each other in general properties, i.e. physical, chemical, thermal and mechanical properties, to say nothing of molecular structure and interatomic (intermolecular) distance, in addition to the fact that the former is an organic material and the latter is an inorganic material. Therefore, it is difficult to make these two materials adhere (bond) to each other. Even if the two materials can be made to adhere (bond) to each other, adhesion strength (bond strength) is very small. Therefore, there is a strong possibility that the two materials will peel or dissociate from each other upon receiving an in-process load during a semiconductor device manufacturing operation or an in-service load, causing an interruption of a manufacturing process or leading to stopping operation after starting of service.

According to the prior art, attempts have been made to create an excellent bonded layer by physically roughening a surface of an insulating layer, serving as an underlayer for a diffusion barrier layer before it is formed, or activating a surface of the insulating layer by a chemical treatment. However, the diffusion barrier layer is originally a very thin film having a thickness of 10 to 50 nanometers. It is therefore difficult to obtain a suitable roughness for this thin diffusion barrier layer, and it is extremely difficult to form inner surfaces of fine recesses in the underlayer (insulating layer) into an optimum surface configuration. Further, a chemical activation treatment may cause pollution problems due to waste fluid. Therefore, it costs a great deal to treat the waste fluid. Accordingly, the chemical activation treatment is not preferable from a practical point of view.

Meanwhile, it is conceivable to bring an active species (e.g. hydrogen radicals) into contact with a surface of an interlayer insulative film layer to thereby reduce a surface of an underlayer or sever an atomic bond thereof in advance (pre-treatment). It is also conceivable to raise a temperature after deposition of a diffusion barrier layer to thereby induce inter-diffusion or form a compound by a reaction between these two layers (post-treatment). However, because of an extremely large difference in physical properties between materials of the two layers, neither the pre-treatment nor the post-treatment produces significant effects. These treatments may produce a contrary result, i.e. formation of a harmful reaction product.

Further, with regard to use of copper as a conductive material during fabrication of a semiconductor device, there is another problem as discussed below.

To date, it has been considered to be quite difficult to perform anisotropic etching (hereinafter referred to as an etching, where appropriate) of Cu by way of a dry etching method using a gas without any liquid agent applied thereto, and actually there has been found no such successful example put into practical use. Among a small number of research papers, there has been reported a result of a case where a reactive ion etching (RIE) was conducted by using a mixed gas composed of $SiCl_4$, $Cl_2$, $N_2$, and $NH_3$ [Arita et al. P.1156 in the Applied Physics, 61, 11 (1992)]. According to this paper, it is reported that a successful processing shape was obtained with an etching rate of about 100 nm/min as shown in FIG. 4. Herein, $NH_3$ gas was added to a material gas for a purpose of forming a protective film of SiN family over a side wall face in order to maintain a directional property of etching. Nevertheless, there has been a problem in that an etching rate decreases as flow rate of $NH_3$ increases, as shown in FIG. 4.

On the other hand, differently from etching of a substrate of a semiconductor, there has been disclosed a technology to be used for removing a copper film deposited within an apparatus for chemical vapor deposition (CVD) of copper, in which the copper film is brought into contact with gaseous hexafluoro-acetylacetone [$C_5H_2O_2F_6$, hereinafter abbreviated as H(hfac)] and oxygen gas so as to form a volatile copper complex compound [Tomoaki Koide et al. 30P-YA-16 in "The proceedings of the 47th Applied Physics Related Association Lecture Meeting" ('00.3)]. This technology has taught that there occurs no reaction with the copper when the copper film is brought into contact With only the H(hfac) gas, but the H(hfac) gas added with $O_2$ gas causes such reactions as oxidization of metal copper as denoted by the following formula (1), and complexing and desorption of copper oxide as denoted by the following formula (2), resulting in a deposited copper film being vaporized and removed.

$$4Cu+O_2 \rightarrow 2Cu_2O \quad 2Cu+O_2 \rightarrow 2CuO \tag{1}$$

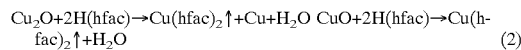

$$Cu_2O+2H(hfac) \rightarrow Cu(hfac)_2\uparrow+Cu+H_2O \quad CuO+2H(hfac) \rightarrow Cu(hfac)_2\uparrow+H_2O \tag{2}$$

FIG. 5 is a diagram illustrating an example of actual measurement of a removing rate of Cu reported in the above paper. As can be seen from FIG. 5, a copper substrate heated up to 300° C. is etched and removed at a rate of approximately 400 nm/min. However, if the principle disclosed in this paper is applied to an etching process of semiconductor device fabrication without any modifications, there would occur an isotropic etching as shown in FIG. 6, causing considerable disadvantages in wire-patterning of a fabricated semiconductor device.

Referring to FIG. 6, a Si substrate as designated by 17 has an insulation layer 14a, a Cu wiring layer 14, and a resist layer (mask) 18, each of which layers is sequentially built one on another on top of the Si base layer 17, wherein if H(hfac) gas 19 is blown into an aperture 18a of the resist layer 18 to etch the Cu wiring layer 14, resultant etch pit 12 formed by isotropic etching with the H(hfac) gas 19 expands in a lower location of the resist layer 18 to be greater than a cross sectional area of the aperture 18a, thus making it impossible for the etch pit 12 to be formed limitedly in a vertically downward direction from the aperture 18a of the resist layer 18. That is, there have been problems associated with the prior art, including that anisotropic (directional) etching of a Cu wiring layer is impracticable.

SUMMARY OF THE INVENTION

The present invention is made in the light of the above-described circumstances.

An object of the present invention is to provide a method and apparatus for applying a surface treatment to a surface of a substrate, with the surface treatment being selected from a group consisting of the following surface treatments: coating, denaturation, modification and etching. The method comprises the steps of bringing a surface treatment gas into contact with a surface of a substrate, and irradiating the surface of the substrate with a fast particle beam to enhance activity of the surface and/or the surface treatment gas, thereby facilitating a reaction between the surface and the gas.

In accordance with a first aspect of the present invention, there is provided a method of coating a surface of a substrate, provided with fine recesses, by chemical vapor deposition technology, wherein the surface of the substrate is irradiated with a fast particle beam in such a manner that the beam reaches a surface of the recesses. Irradiation is effected in parallel with and/or prior to, or alternatively with, a supply of a source gas for performing deposition.

A density of a nucleation site of deposition on the surface of the substrate is greatly increased by the irradiation. As a result, a surface morphology of a deposition layer deposited on the surface of the substrate is likely to be formed planar. In addition, choking at an inlet port of a recess can be avoided, and thereby a void defect can be prevented from occurring by adjusting a particle beam so that an irradiation intensity thereof may vary depending on a position on the surface of the substrate so as to control or specify a dominating growth direction of a deposition layer. At the same time, adhesiveness between the deposition layer and the surface of the substrate can be extremely improved since mixing at an atomic level can be generated in an interface between the deposition layer and the surface of the substrate by increasing irradiation energy.

The particle beam may be selected from the group consisting of an electron beam, an ion beam, an atomic beam or a molecular beam. The substrate may be a silicon substrate for fabricating a semiconductor device, and the recess formed on the surface of the substrate is a patterned recess for forming an interconnect of the semiconductor device. The source gas is an organic complex gas containing copper as component thereof. It is preferable to control particle energy of the beam to be between 200 eV and 10 keV.

The present invention also provides an apparatus for conducting the above-stated method, in which the apparatus comprises at least an ion source necessary for generating a particle beam, an ion accelerating mechanism, and a supply mechanism of a source gas containing an element for coating a surface of a substrate. The apparatus is equipped with a function for irradiating a substrate surface with a generated particle beam.

In accordance with another aspect of the present invention, there is provided an interconnect structure of a semiconductor device in which a strong bond is formed between an interlayer insulative film layer, consisting essentially of an organic material with a low dielectric constant, and a diffusion barrier layer, formed from a thin film of a metal or a compound, so that peel or dissociation will not occur at an interface between these two layers. The interconnect structure may include a conductive portion provided in contact with the diffusion barrier layer. According to the present invention, a mixing area is formed in the vicinity of the interface between the interlayer insulative film layer and the diffusion barrier layer by fast particle irradiation. In the mixing area, atoms or molecules constituting the interlayer insulative film layer and the diffusion barrier layer are mixed together.

The interconnect structure may be provided in a semi-conductor device, in which the interlayer insulative film layer, the diffusion barrier layer and the conductive portion are formed in fine patterns. Preferably, the interlayer insulative film layer is made of a material selected from the group consisting of siloxane-based organic compounds and other organic polymers, and the conductive portion is made of copper.

The present invention also provides a method of producing an interconnect structure by forming a diffusion barrier layer in contact with an interlayer insulative film layer, and forming a conductive portion in contact with the diffusion barrier layer. Forming the diffusion barrier layer in contact with the interlayer insulative film layer includes a film deposition step of depositing a specified element, and a particle beam irradiation step of performing irradiation with a particle beam. The film deposition step and the particle beam irradiation step are carried out simultaneously or individually or alternately. Preferably, the particle beam irradiation step is carried out with a particle energy in the range of from 800 eV to 2 MeV.

It is generally known that during a thin film deposition process or after deposition of a thin film, the thin film and an underlayer are irradiated with a fast particle beam, such as an ion beam, an atom beam or a molecular beam, to induce mixing of atoms constituting the thin film and the underlayer in the vicinity of an interface therebetween. In the mixing area, a disorderly mixed state of atoms is usually obtained, in which a regular crystal lattice arrangement is disordered remarkably. As a distance from such a disorderly mixed area increases, an arrangement of atoms gradually shifts to a regular arrangement similar to that before fast particle irradiation.

It is known that when a boundary area between two layers is formed with a structure in which atoms constituting the two layers are mixed together as stated above, the area provides an extremely high adhesion strength (bond strength). According to the present invention, a mixing area, in which atoms constituting an interlayer insulative film layer and a diffusion barrier layer are mixed together, is formed in the vicinity of an interface between these two layers by fast particle irradiation. Therefore, the interlayer insulative film layer and the diffusion barrier layer are bonded together with a sufficiently high adhesion strength. Accordingly, it is possible to provide an interconnect structure free from a likelihood of peel or dissociation at the interface between the interlayer insulative film layer and the diffusion barrier layer.

FIG. 7 shows adhesion strength when polyethylene, which is substantially difficult to bond to any mating material by nature, is made to adhere to silicon (Si) by a deposition method using an ion beam [i.e. vacuum evaporation and deposition of polyethylene on a Si substrate by a cluster ion beam method; excerpted from Kou Yamada "Thin Film Design by Ion Beam" (September 1991, Kyoritsu Shuppan), p. 108]. Despite a combination of two materials that are normally almost, or one hundred percent, impossible to bond together, an adhesion strength as high as 5 to 15 kgf/cm² is obtained by appropriately selecting an ion accelerating voltage and an ion current. Thus, noteworthy characteristics are exhibited. This phenomenon is considered attributable to mixing of atoms in the vicinity of the interface between the two materials induced by ion irradiation. The phenomenon cannot rationally be explained otherwise.

In general, when a substrate is irradiated with a fast particle beam, e.g. a fast ion beam, atomic beam or molecular beam, an effect of beam irradiation on a substrate surface differs according to particle energy.

FIG. 8 shows a tendency of penetration depth of collided particles into a substrate when the substrate is irradiated with a fast particle beam, together with principal actions applied to the substrate. As particle energy increases, penetration depth of particles into the substrate increases, and the principal actions shift from vacuum evaporation and deposition onto a surface of the substrate through sputtering in a surface layer to implantation into the substrate and mixing. It is known that a mixing action occurs actively particularly when irradiation particle energy is in the range of from 3 keV to 3 MeV as shown in FIG. 8, and atoms of the substrate that collide with implanted particles are sputtered from a lattice and collide with neighboring substrate atoms successively. That is, cascade collision occurs, and thus lattice defects are produced. Mixing of atoms caused by such cascade collision is the essence of the mixing action. The mixing action takes place most vigorously when the irradiation particle energy is in the above-described range of from 3 keV to 3 MeV.

When mixing action occurs at a moderate depth, a bond strength between a substrate and a deposited film on a substrate surface becomes remarkably high. This phenomenon is considered to be due to the fact that atoms or molecules constituting the deposited film and the substrate are mixed together by the mixing action. In the process shown in FIG. 1, two materials that can hardly adhere to each other by nature are made to adhere (bond) together successfully by making good use of this mixing action. Thus, it is possible to perform film deposition with favorable adhesion (bond) strength even for a combination of materials that have heretofore been regarded as impossible to bond to each other by using a fast particle beam with properly controlled energy.

Accordingly, use of fast particle beam action allows deposition of a diffusion barrier layer of a compound such as TaN, WN, TiN, TaSiN, WSiN or TiSiN, or a metal such as Ta, onto an interlayer insulative film layer of an organic material with a sufficiently high adhesion (bond) strength.

In accordance with a further aspect of the present invention, there is provided a method for performing anisotropic etching of a substrate in a dry etching process, comprising the steps of: bringing a surface of a substrate into contact with a fluid that reacts well with a material of the substrate; compounding a gas including a component element of a material of the substrate resulting from a chemical reaction between the surface of the substrate and the fluid; and consequently removing the material from the surface of the substrate sequentially, wherein a gas is used for the fluid that reacts well with the material of the substrate, and further an activity is enhanced locally in a desired region of the surface of the substrate by irradiating the desired region with a beam selected from the group consisting of an ultra violet beam, a laser beam, an electron beam, an atomic beam, and a molecular beam, to thus allow anisotropic etching to proceed.

This method will enable copper to be subjected to anisotropic etching in a dry etching process, while it has been conventionally considered to be infeasible to subject copper to such anisotropic etching. It is preferable that particle energy of the beam is controlled to be between 200 eV and 1 keV so that the beam brings about sputtering of atoms in the surface of the substrate to enhance activity of an irradiated region.

The present invention further provides an apparatus for performing anisotropic etching of a substrate in a manner of dry etching, with the apparatus comprising: a reaction chamber; an ion generating and accelerating mechanism used as a source for generating a particle beam, such as an ion beam or an atomic beam; and a reactive fluid supply mechanism for supplying a reactive fluid that is reactive with a material of the substrate, wherein the reactive fluid is supplied from the reactive fluid supply mechanism to a surface of the substrate disposed in a predetermined location within the reaction chamber, while the particle beam, such as the ion beam or the atomic beam, is directed from the ion generating and accelerating mechanism against the surface of the substrate, so as to enhance an activity locally in a desired region of the surface of the substrate, and to thus allow anisotropic etching to proceed.

Furthermore, the present invention provides an apparatus for generating a fast particle beam suitable for use in the method and apparatus in accordance with the present invention as stated above. This apparatus comprises a housing for receiving a predetermined gas, anode and cathode plates provided in the housing with a predetermined spacing being interposed therebetween, and arranged in parallel with each other. The anode and cathode plates each are provide d with a plurality of through holes, the spacing is set to be in the range of D/14–D, wherein D is a diameter of the anode and cathode plates. The anode and cathode plates are adapted to be supplied with a high voltage to cause a plasma discharge therebetween so as to ionize the predetermined gas, thereby forming a fast particle beam. It is preferable to make the range of the diameter of the anode and electrode plates be in the rage of 1 mm–14 mm.

The above and other objects, features and advantages of the present invention will become more apparent from the following description of the preferred embodiments thereof, taken in conjunction with the accompanying drawings.

BRIEF DESCRIPTION OF THE DRAWINGS

FIG. 11 is a diagram similar to that of FIG. 8;

FIG. 27(a) is a schematic cross sectional view showing a condition of a coating layer formed in accordance with the present invention;

FIG. 27(b) is a schematic cross sectional view showing a condition of the coating layer which has been further developed as compared with that shown in FIG. 27(b);

FIG. 28 is a schematic cross sectional view of a semiconductor substrate fabricated in accordance with the present invention;

DETAILED DESCRIPTION OF THE PREFERRED EMBODIMENTS

Preferred embodiments of the present invention will now be described in detail with reference to the attached drawings.

Figure 9:
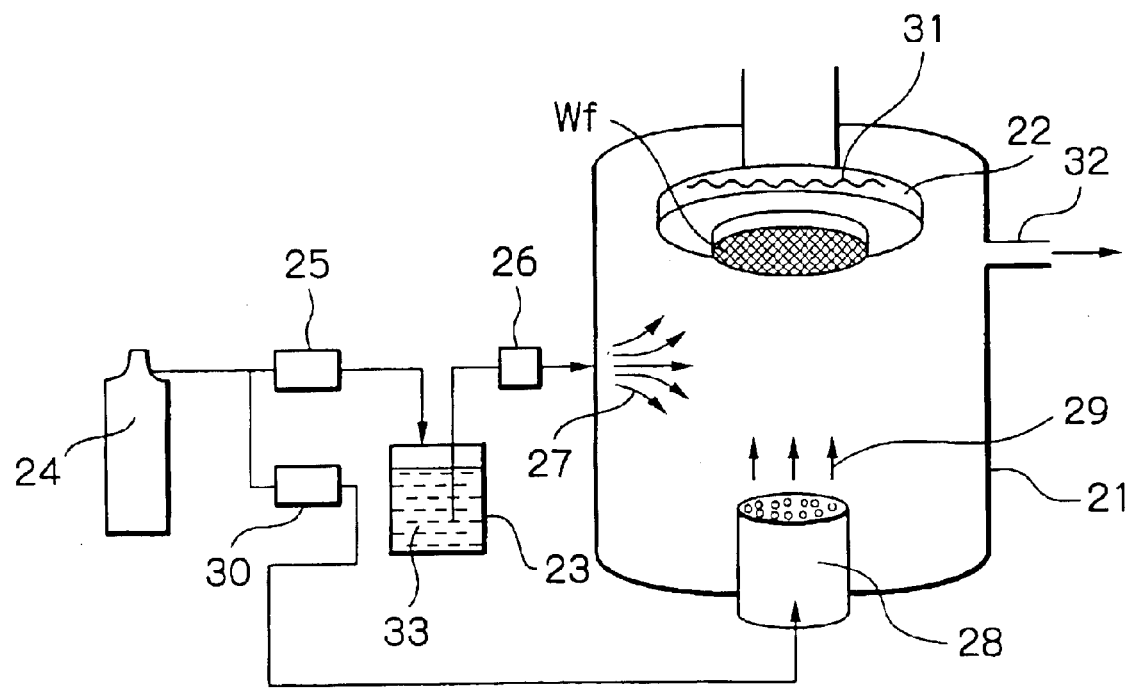
FIG. 9 is a schematic drawing showing an exemplary configuration of a coating apparatus in accordance with the present invention.

FIG. 9 is a schematic diagram illustrating an exemplary configuration of a coating apparatus of CVD technology according to the present invention. In FIG. 9, reference numeral 21 designates a reaction chamber which has a susceptor 22 arranged therein for loading/holding a substrate Wf thereon, and an exhaust port 32 of the reaction chamber 21 is connected to a vacuum evacuation system equipped with a vacuum pump or the like so as to be decompressed to a specified pressure. Reference numeral 23 designates a source container for containing a liquid source, from which the liquid source is sent to a vaporizer 26 by supplying $H_2$ gas from an $H_2$ reservoir 24 via a flow controller 25 to the source container 23, so as to be vaporized in the vaporizer 26 and then to be supplied into the reaction chamber 21 as a source gas 27.

Reference numeral 28 designates a fast ion generating mechanism for generating and applying a hydrogen (including hydrogen ion $H^+$, hydrogen radical $H^*$, hydrogen molecular $H_2$, or the like) beam 29 onto the substrate Wf loaded/held on the susceptor 22 in the reaction chamber 21, and the fast ion generating mechanism 28 is designed so as to be supplied with $H_2$ gas from the $H_2$ reservoir 24 via a flow controller 30. Reference numeral 31 designates a heating/cooling mechanism integrated into the susceptor 22 for heating/cooling the substrate Wf. The present coating apparatus is designed such that the source gas is supplied from the vaporizer 26 into the reaction chamber 21 so as to interact with the hydrogen beam 29 to cause a reaction such as decomposition/synthesis of the source material and eventually to deposit a desired amount of copper on the substrate Wf. In the source container 23, hexafluoroacetylacetunate-Cu(I)-trimethylvinyl-silane (hfac)(tmvs) is contained.

Figure 10A:
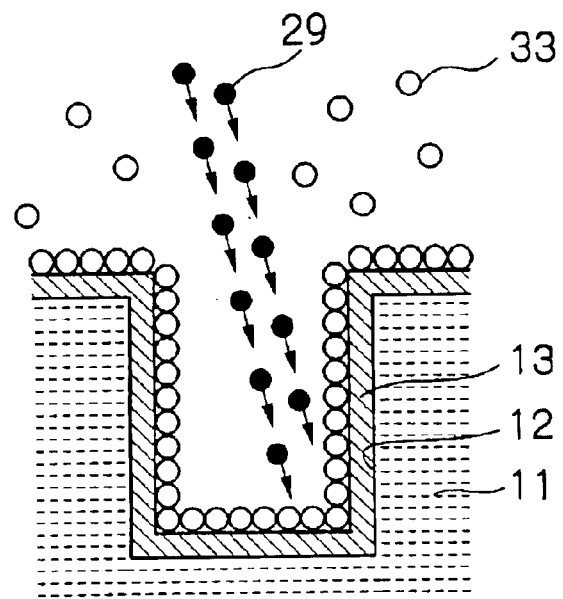
FIG. 10(a) is a schematic cross sectional view illustrating a copper-coating process in accordance with the present invention for a surface of a substrate formed with a recess, in which the surface is irradiated with a slanting hydrogen beam impinging onto the surface.
Figure 10B:
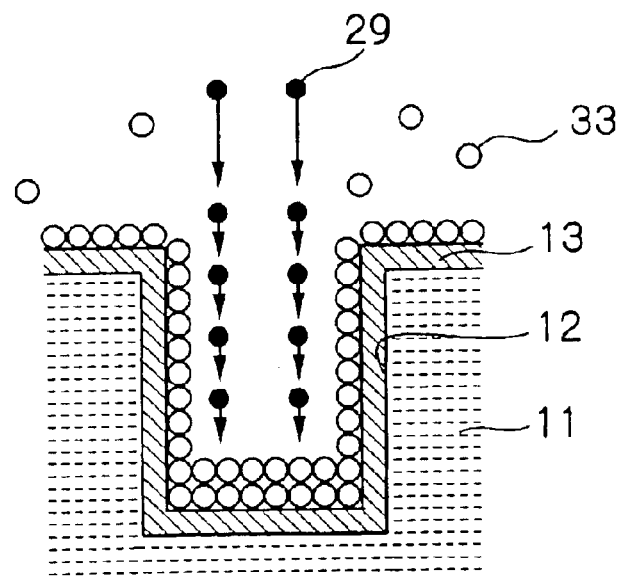
FIG. 10(b) is a schematic cross sectional view illustrating the copper-coating process in which the hydrogen beam impinges onto the surface in a direction normal to the same.

FIGS. 10(a) and 10(b) show a process where a copper-coating is applied to a fine recess (trench, hole, or the like), formed in a surface of the substrate Wf, by the coating apparatus of FIG. 9. FIG. 10(a) shows a case where a surface of the recess is coated by a copper film, which is mainly employed for forming a seed layer indispensable to subsequent copper electroplating. FIG. 10(b) shows another case where coating is conducted to such an extent that the recess is filled with copper, whereby electroplating is not needed.

In either case as shown in FIGS. 10(a) and 10(b), first the surface of the substrate absorbs source material Cu (hfac)(tmvs) 33, then the fast hydrogen (including $H^+$, $H^*$, $H_2$, or the like) beam 29 is irradiated thereto to apply necessary energy to the absorbed Cu (hfac)(tmvs), and eventually to decompose the source material to form a deposition of metal copper. A chemical reaction during the above processes is supposed to be represented by reaction formulas (1), (2) below:

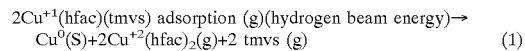

where, $H^*$ is a hydrogen radical.

According to this embodiment, since the hydrogen beam 29 having high energy is directed to the surface of the substrate Wf, bindings between atoms on a surface of diffusion barrier (TaN) 13 are released at innumerable points on the surface of the substrate. Since a surface energy is enhanced in a portion where binding atoms are broken, and as such portions emerge everywhere to promote nucleation, a number of nucleation sites is greatly increased.

Figure 1:
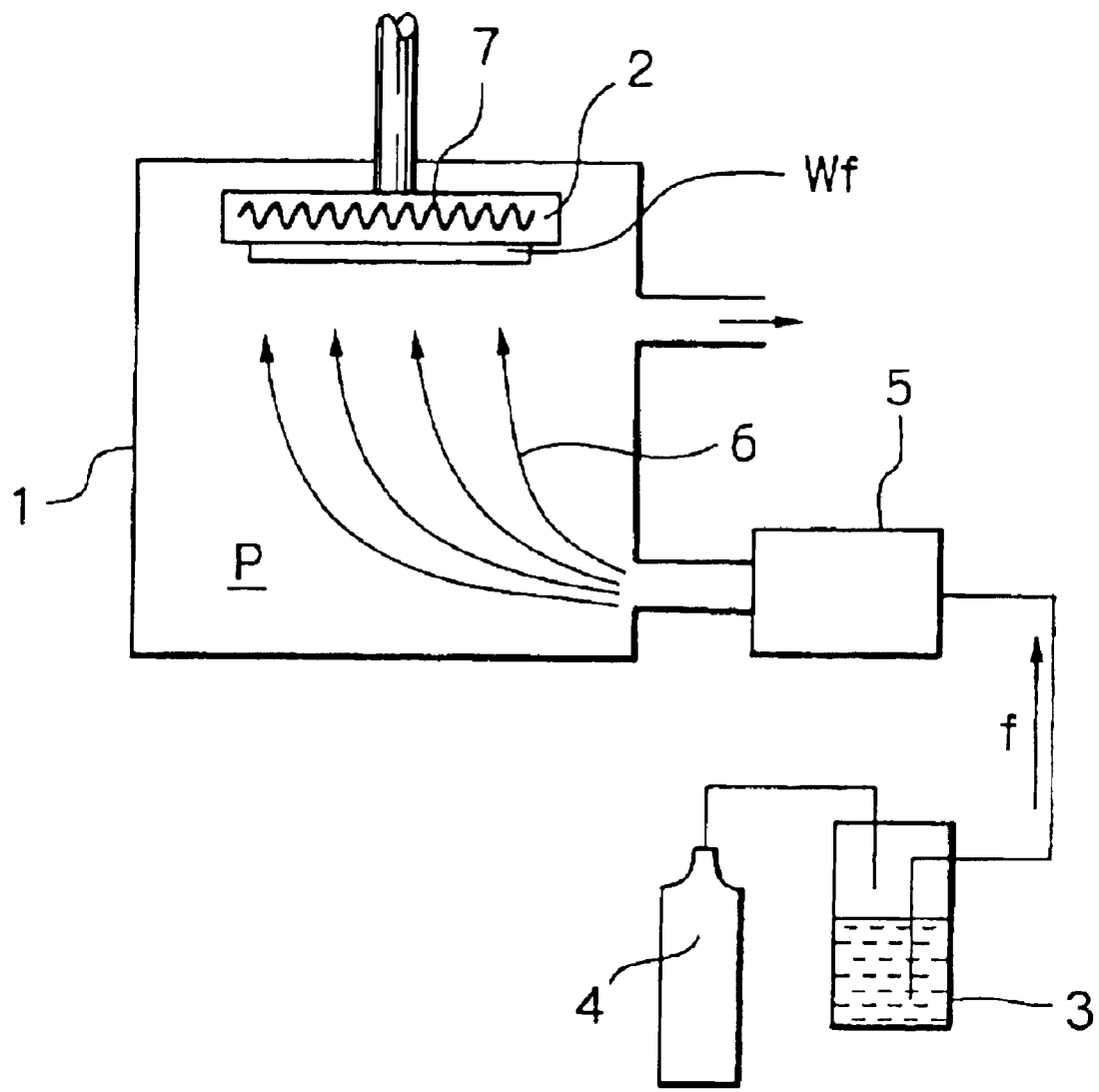
FIG. 1 is a schematic diagram illustrating an exemplary configuration of a coating apparatus according to conventional CVD technology.
Figure 2A:
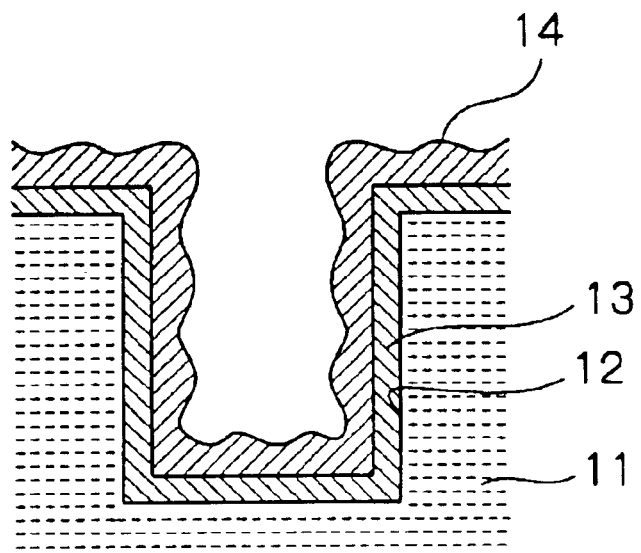
FIG. 2(a) is a schematic cross sectional view illustrating a coating condition of a substrate surface with a recess, which has been coated with copper.
Figure 2B:
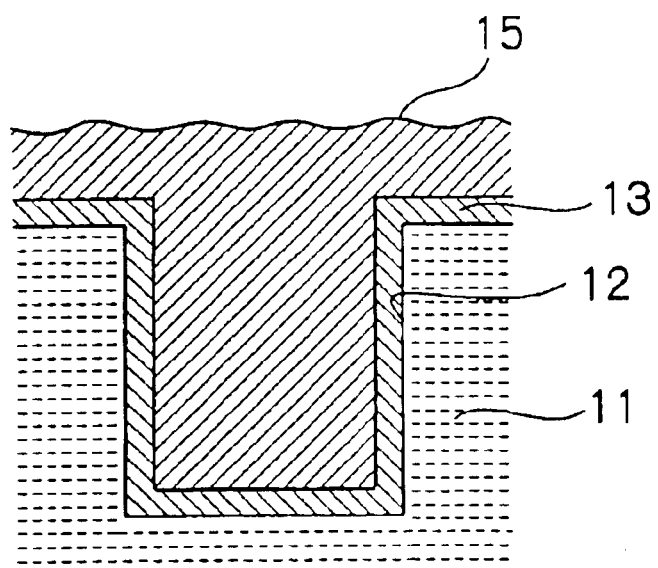
FIG. 2(b) is a schematic cross sectional view illustrating a coating condition of the same substrate surface in which coating has proceeded to an extent such that the copper fills the recess.
Figure 3A:
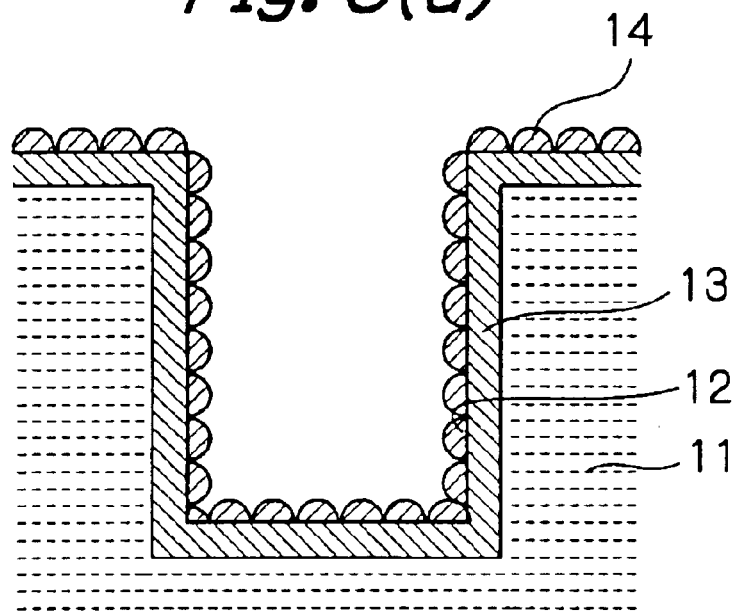
FIG. 3(a) is a schematic cross sectional view similar to FIG. 2(a), while illustrating a typical problem caused in a copper coating process in accordance with the conventional CVD technology.

On the other hand, since a surface diffusion rate of copper atoms generated by decomposition of the source material remains at the same level as that of an ordinary case where no irradiation by hydrogen beam 29 is effected, granular deposition shown in FIG. 3(a) decreases in size, thereby resulting in an increase in its numeral density. This enhances planarization of the deposition layer, thereby allowing avoidance of a film deposition with a fairly rough surface. In addition, as shown in FIG. 10(a), when a thin film is to be formed on the surface in the recess, a uniform and continuous thin copper film can be formed on a bottom and a side wall by depositing copper while controlling a tilting angle of an irradiating direction of the hydrogen beam so as to make a density of nucleation uniform.

Figure 3B:
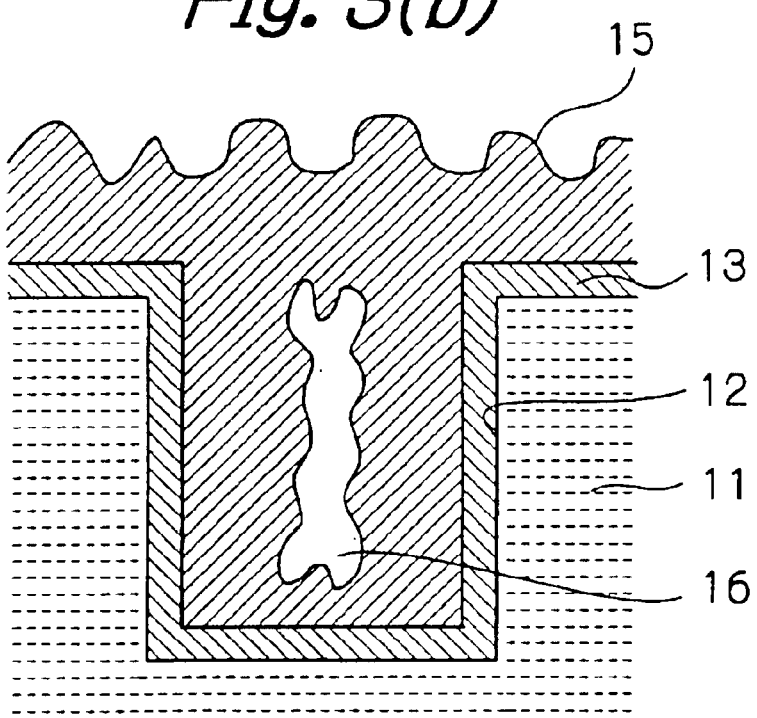
FIG. 3(b) is a schematic cross sectional view similar to FIG. 2(b), while illustrating another typical problem, i.e., creating of a void.
Figure 4:
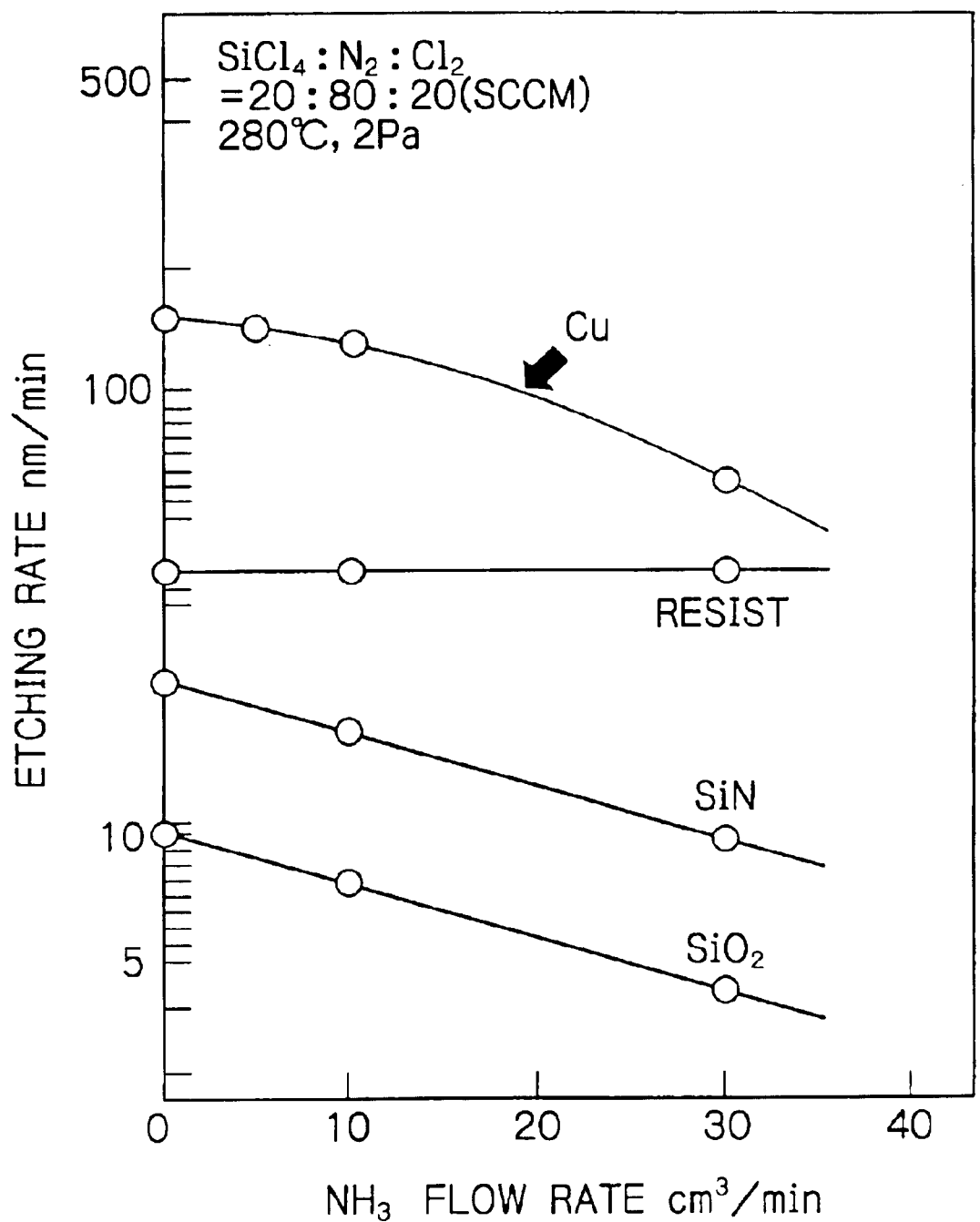
FIG. 4 is a diagram illustrating an effect on a reactive ion etching rate for Cu caused by adding $NH_3$ to a mixed etching gas composed of $SiCl_4$, $Cl_2$, and $N_2$.

Further, when the irradiating direction of the hydrogen beam 29 is restricted to be perpendicular to the bottom and to be parallel with the side wall of the recess formed in the surface of the substrate Wf as shown in FIG. 10(b), an irradiation energy density to the bottom is made to be much greater as compared with that on the side wall, and consequently, decomposition or dissociation of absorbed source gas molecularly occurs substantially only on a bottom surface. Accordingly, a growth direction of copper deposition is limited to one direction from the bottom toward an inlet port of the recess. As a result, choking at the inlet port of the recess caused by a protrusion (overhanging) of deposited copper can be avoided, and thereby also void defect 16 shown in FIG. 3(b) can be prevented from occurring.

According to the method of the present invention, since film deposition is performed under a normal operating pressure range of about $1 \times 10^{-4}$ Torr or lower, which is much lower than that of ordinary CVD, the film deposition can be performed in a so-called molecular flow area where a mean free path of gaseous molecules is greater than a size of the apparatus. Since there is no gas stagnant layer near the surface of the substrate Wf because of the molecular flow area, which is different from a particle flow space for conventional CVD, deposition can be performed independently from a macroscopic gas flow rate. In other words, relatively high speed deposition can be accomplished with a smaller source gas flow rate allowing an improvement in source consumption efficiency. Further, in contrast to the fact that in ordinary heat CVD hydrogen dissociation hardly occurs, and accordingly, only a reaction represented by the formula (1) occurs (which means that only a half of Cu contained in the source material is used), according to the method of the present invention since there exists abundant active hydrogen such as hydrogen ion $H^+$ or hydrogen radical $H^*$, and accordingly, a reaction represented by the formula (2) also is likely to occur, Cu otherwise possibly wasted as components of exhaust gas in the ordinary CVD can be used effectively to be precipitated and deposited. As can be understood also from this point, a deposition rate is increased (theoretically twice as fast as a current one) and also a source utilization factor can be improved.

Figure 6:
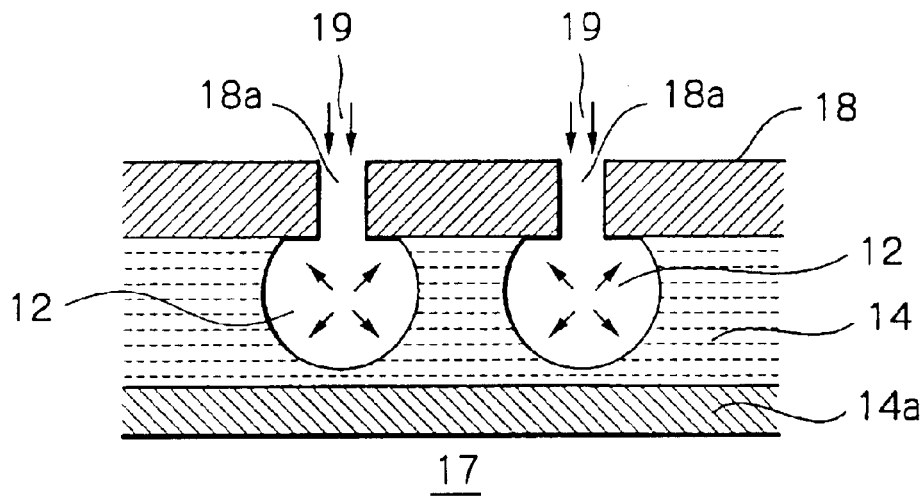
FIG. 6 is a schematic drawing for explaining isotropic etching by H(hfac)+$O_2$ gas.

Further, since by irradiating a hydrogen beam 29 of 200 eV to 10 keV, there occurs not only sputtering on a surface of the substrate Wf but also an atomic level mixing in an interface between a copper deposition layer and the substrate caused by an inward penetration of hydrogen (see FIG. 6), an adhesive/bonding property between the copper deposition layer and the substrate is greatly improved. Although a hydrogen beam is employed as the particle beam in the above embodiment, it is a matter of course that another type of beam may be used.

A useful effect may be brought about by irradiating a substrate with the hydrogen beam prior to supply of the copper source gas. This is due to the fact that a nucleation site in an under-layer is increased by releasing/reducing a part of atomic bindings in a surface of a TaN layer, which serves as a diffusion barrier of the under-layer, and/or allowing hydrogen to be adsorbed/penetrated into the surface thereof.

Although in the above embodiment copper (Cu) is deposited on the surface of the substrate, material to be deposited is not limited to copper, and another metal may be substituted therefor.

In accordance with the above-stated embodiment, since a density of a nucleation site of deposition on the surface of the substrate is greatly increased by irradiating a particle beam onto the substrate either in conjunction with or prior to supply of the source gas, a surface morphology of the deposition layer deposited on the surface of the substrate is likely to be planer. In addition, choking at the inlet port of the recess can be avoided and thereby a void defect can be prevented from occurring by adjusting the particle beam so that irradiation intensity thereof varies depending on a position on the surface of the substrate, so as to control or specify a dominating growth direction of the deposition layer, and at the same time, adhesiveness between the deposition layer and the surface of the substrate can be greatly improved by causing mixing at an atomic level in an interface between the deposition layer and the surface of the substrate by irradiation with the particle beam.

Further, since the coating apparatus of the embodiment comprises an ion source, ion accelerating mechanism and source supply mechanism, and is adapted to irradiate the particle beam onto the substrate in parallel with a process for applying ordinary chemical vapor deposition and/or prior to the supply of the source gas, a surface morphology of a deposition layer deposited on the surface of the substrate is likely to become planar, and by controlling a dominating growth direction of the deposition layer, choking at the inlet port of the recess can be avoided and thereby a void defect can be prevented from occurring, and at the same time adhesiveness between the deposition layer and the substrate can be greatly improved.

With reference to FIGS. 12–20, another embodiment of the present invention will be explained.

Figure 12:
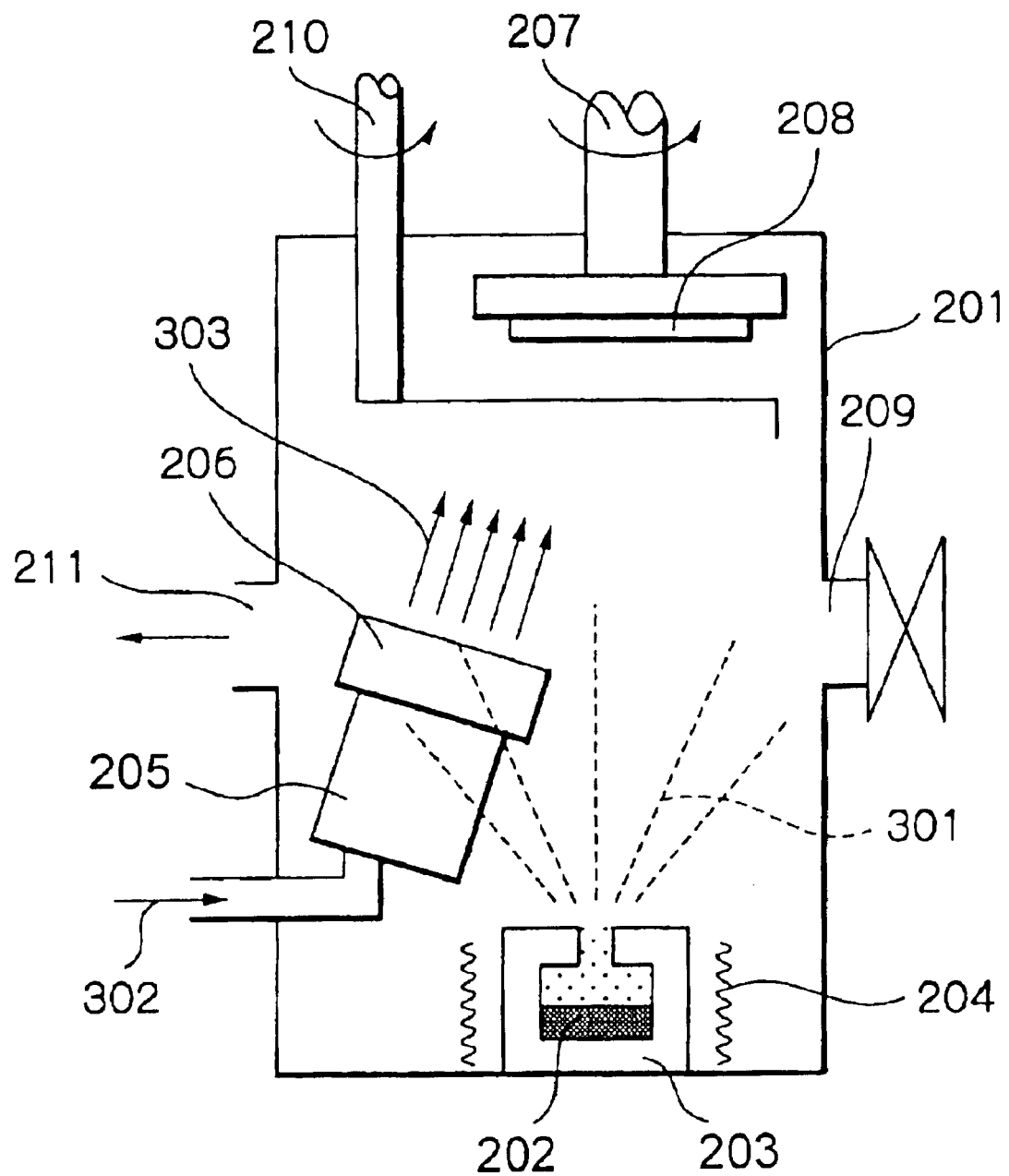
FIG. 12 is a schematic diagram showing a structural example of a deposition apparatus by evaporation and irradiation for producing an interconnect structure according to the present invention.

FIG. 12 is a diagram showing a structural example of a deposition apparatus that performs evaporation and irradiation for producing an interconnect structure according to an embodiment of the present invention. In FIG. 12, a deposition chamber 201 contains a crucible 203 accommodating a Ta source 202. A heater 204 is provided around an outer periphery of the crucible 203. By heating the crucible 203 with the heater 204, Ta vapor 301 is emitted in the deposition chamber 201.

In addition, an ion source 205 and a neutralizer 206 are placed in the deposition chamber 201. When the ion source 205 is supplied with $N_2$ gas 302, N ions are generated from the ion source 205. The N ions are passed through the neutralizer 206 to form an N particle ( atomic) beam 303. The N particle beam 303 is directed to irradiate a substrate 208, e.g. a semiconductor wafer, held on a substrate holder 207. That is, in the deposition apparatus, irradiation with the N particle beam 303 is performed in parallel to vacuum evaporation and deposition of Ta. An aim of this arrangement is to synthesize TaN and to cause mixing of evaporated substances in the substrate 208.

It should be noted that the deposition chamber 201 is provided with an inlet port 209 for a source gas and a shutter 210 for blocking passage of the Ta vapor 301 and the N particle beam 303 to stop irradiation of the substrate 208. Further, the deposition chamber 201 is provided with an evacuation port 211 connected to a vacuum evacuation system (not shown) to evacuate the deposition chamber 201.

In the deposition apparatus shown in FIG. 12, vacuum evaporation and deposition of the Ta vapor 301 and irradiation with the N particle beam 303 may be performed simultaneously or individually or alternately. It is conceivable to use various duty operations appropriately according to need. In the process shown in FIG. 12, N is supplied in the form of the $N_2$ gas 302. However, it is also possible according to circumstances to use TaN as a source material and to supply Ar to the ion source 205, thereby irradiating the substrate 208 with a fast Ar particle beam. It is also possible to introduce a source gas containing Ta from the inlet port 209 instead of using a source material, for example.

Figure 13:
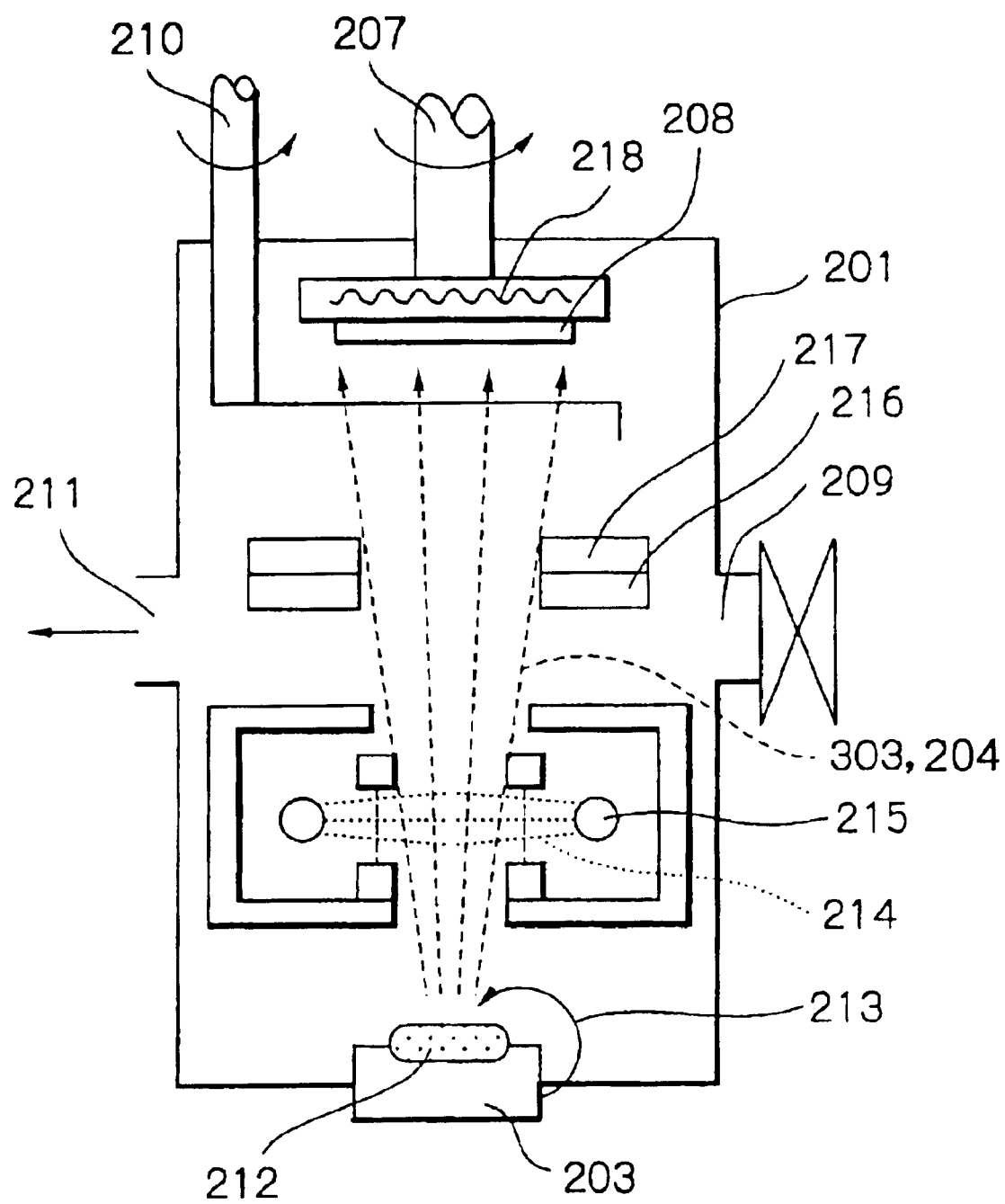
FIG. 13 is a schematic diagram showing a structural example of a cluster particle beam deposition apparatus for producing an interconnect structure according to the present invention.

FIG. 13 is a diagram showing a structural example of a cluster particle beam deposition apparatus for producing an interconnect structure according to another embodiment of the present invention. In FIG. 13, the same reference numerals as those in FIG. 12 denote the same or equivalent portions. A TaN source 212 is placed in crucible 203. The source 212 is heated by irradiation with electrons from an electron gun 213 to generate $N_2$ gas and Ta vapor in the form of an N particle beam 303 and a Ta particle beam 204. These particle beams 303 and 204 are directed to irradiate substrate 208. Deposition chamber 201 further contains an electron accelerating electrode 214, an electron emission source 215, an accelerating electrode 216, a neutralizer 217 and a heater 218. In this process, TaN is used as a source material, and this is applied to the substrate 208 in the form of Ta and N cluster particle beams.

FIGS. 14(a) to 17(c) are diagrams showing examples of a duty operation for source gas supply performed by using the deposition apparatuses shown in FIGS. 12 and 13, together with conditions of film deposition and mixing. Regarding a source supply mode in the deposition apparatus shown in FIG. 12, the Ta vapor 301 and the N particle beam 303 are supplied simultaneously and continuously in many cases. In general, however, it is also possible to supply a part of these source materials in other modes. Thus, various supply methods as shown in FIGS. 14 to 17 can be executed.

Figure 14A:
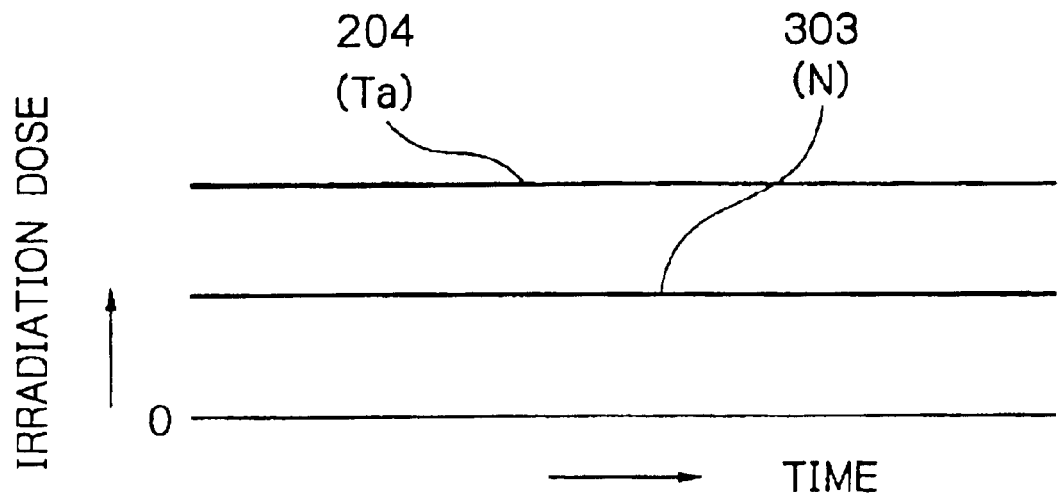
FIG. 14(a) is a diagram showing an example of a duty operation for source gas supply in an interconnect structure producing method according to the present invention.
Figure 14B:
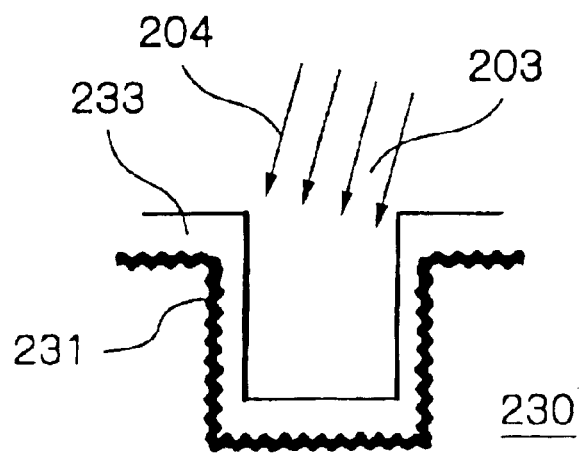
FIG. 14(b) is a schematic cross sectional view showing conditions of film deposition and mixing.

FIGS. 14(a) and 14(b) are diagrams showing a process in which film deposition and mixing are effected by supplying a Ta particle beam and an N particle beam simultaneously and continuously. As shown in FIG. 14(a), the Ta particle beam 204 and the N particle beam 303 are simultaneously and continuously supplied in specified fixed quantities, respectively, to irradiate substrate 208. Consequently, as shown in of FIG. 14(b), a TaN film layer 233 is deposited over a surface of an organic insulating film layer 230 formed on a surface of substrate 208 (not shown). At the same time, a mixing layer 231 is formed in the vicinity of an interface between the TaN film layer 233 and the organic insulating film layer 230. In the mixing layer 231, atoms constituting the organic insulating film layer 230 and the TaN film layer 233 are mixed together.

Figure 15A:
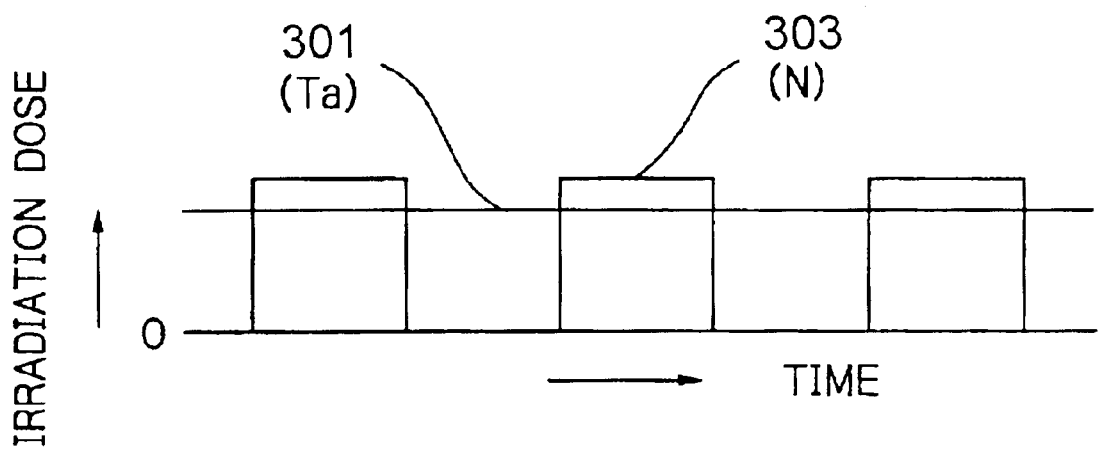
FIG. 15(a) is a diagram showing an example of a duty operation for source gas supply in the interconnect structure producing method according to the present invention.
Figure 15B:
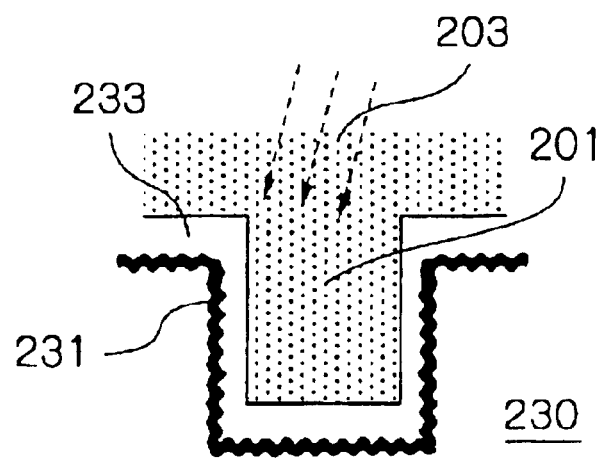
FIG. 15(b) is a schematic cross sectional view showing a condition of film deposition and mixing.

FIGS. 15(a) and 15(b) are diagrams showing a process in which film deposition and mixing are effected by continuously supplying Ta vapor and intermittently supplying an N particle beam. As shown in of FIG. 15(a), the Ta vapor 301 is continuously supplied in a specified fixed quantity, and the N particle beam 303 is intermittently supplied in a specified fixed quantity. Consequently, as shown in FIG. 15(b), a TaN film layer 233 is deposited over a surface of an organic insulating film layer 230 formed on a surface of substrate 208 (not shown). At the same time, a mixing layer 231 is formed in the vicinity of an interface between the TaN film layer 233 and the organic insulating film layer 230. In the mixing layer 231, atoms constituting the organic insulating film layer 230 and the TaN film layer 233 are mixed together.

Figure 16A:
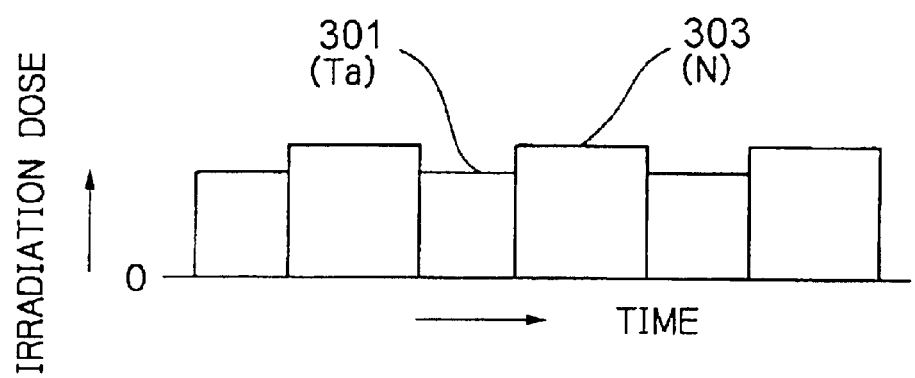
FIG. 16(a) is a diagram showing an example of a duty operation for source gas supply in the interconnect structure producing method according to the present invention.
Figure 16B:
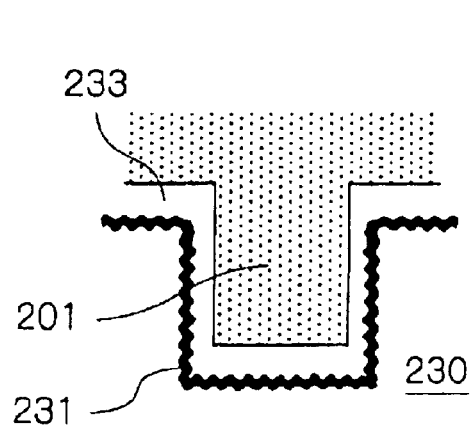
FIG. 16(b) is a schematic cross sectional view showing a condition of film deposition and mixing.
Figure 16C:
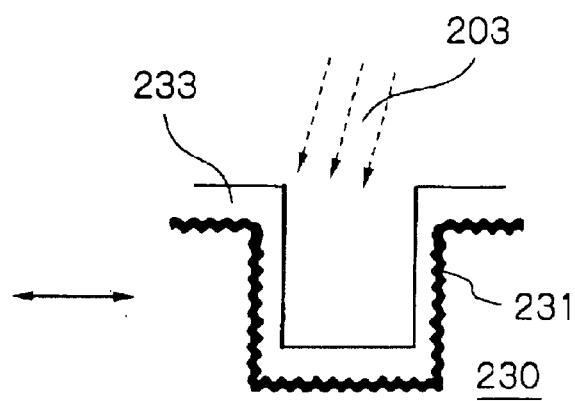
FIG. 16(c) is a schematic cross sectional view showing another condition of film deposition and mixing.

FIGS. 16(a)–16(c) are diagrams showing a process in which film deposition and mixing are effected by supplying Ta vapor and an N particle beam alternately. As shown of FIG. 16(a), the Ta vapor 301 and the N particle beam 303 are alternately supplied in specified fixed quantities, respectively. Consequently, as shown in FIG. 16(b) and FIG. 16(c), a TaN film layer 233 is deposited over a surface of an organic insulating film layer 230 formed on a surface of substrate 208 (not shown), and in parallel to the formation of the TaN film layer 233, a mixing layer 231 is formed in the vicinity of an interface between the TaN film layer 233 and the organic insulating film layer 230. In the mixing layer 231, atoms constituting the organic insulating film layer 230 and the TaN film layer 233 are mixed together.

Figure 17A:
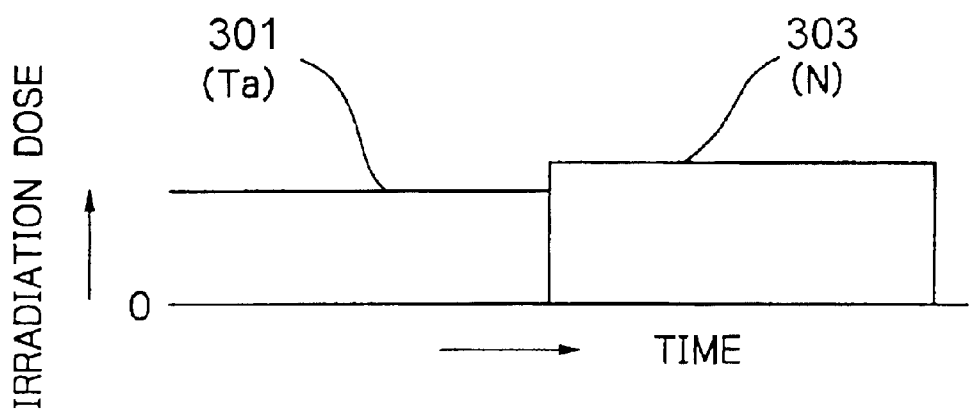
FIG. 17(a) is a diagram showing an example of a duty operation for source gas supply in the interconnect structure producing method according to the present invention.
Figure 17B:
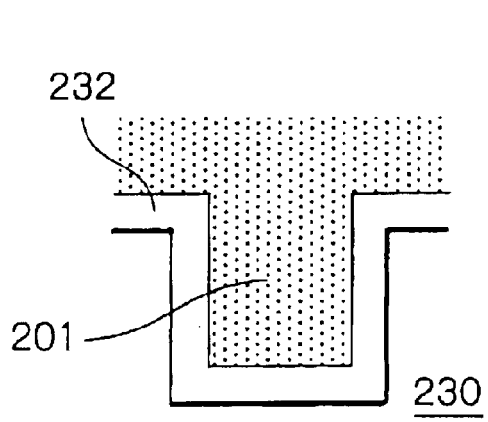
FIG. 17(b) is a schematic cross sectional view showing a condition of film deposition and mixing.
Figure 17C:
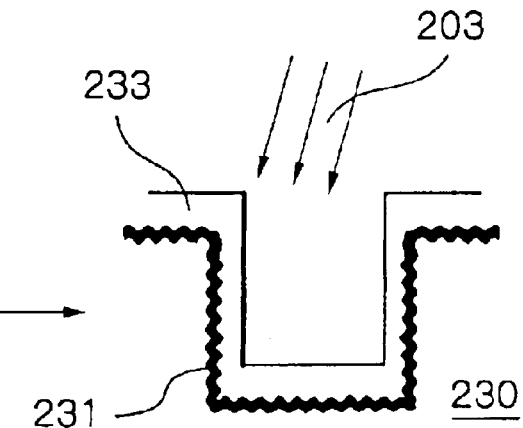
FIG. 17(c) is a schematic cross sectional view showing conditions of film deposition and mixing.

FIGS. 17(a)–17(c) are diagrams showing a process in which film deposition and mixing are effected by supplying an N particle beam after supply of Ta vapor. As shown in FIG. 17(a), Ta vapor 301 is supplied in a specified fixed quantity, and thereafter, substrate 208 (not shown) is irradiated with the N particle beam 303 in a specified fixed quantity. Consequently, as shown in FIGS. 17(b) and 17(c), a Ta film layer 232 is deposited on a surface of an organic insulating film layer 230 formed on a surface of substrate 208 (not shown). Thereafter, the Ta film layer 232 is converted into a TaN film layer 233, and at the same time, a mixing layer 231 is formed in the vicinity of an interface between the TaN film layer 233 and the organic insulating film layer 230. In the mixing layer 231, atoms constituting the organic insulating film layer 230 and the TaN film layer 233 are mixed together.

In the deposition apparatuses shown in FIGS. 12 and 13, generated ions themselves may be used as particles to irradiate the substrate 208. Alternatively, charged particles may be converted into neutral particles by operating the neutralizer 206 (217) before being applied to the substrate 208. In a process of manufacturing semiconductor devices, if there is likelihood of the devices being damaged by being charged excessively, it is desirable to use a neutral atomic or molecular beam obtained by operation of the neutralizer 206 (217) as irradiation particles instead of charged particles such as ions.

Regarding the processes shown in FIGS. 14(a) to 17(b), a process by which film deposition and mixing are effected simultaneously is known as "dynamic mixing". A process by which mixing is caused after completion of film deposition is known as "static mixing".

Figure 18:
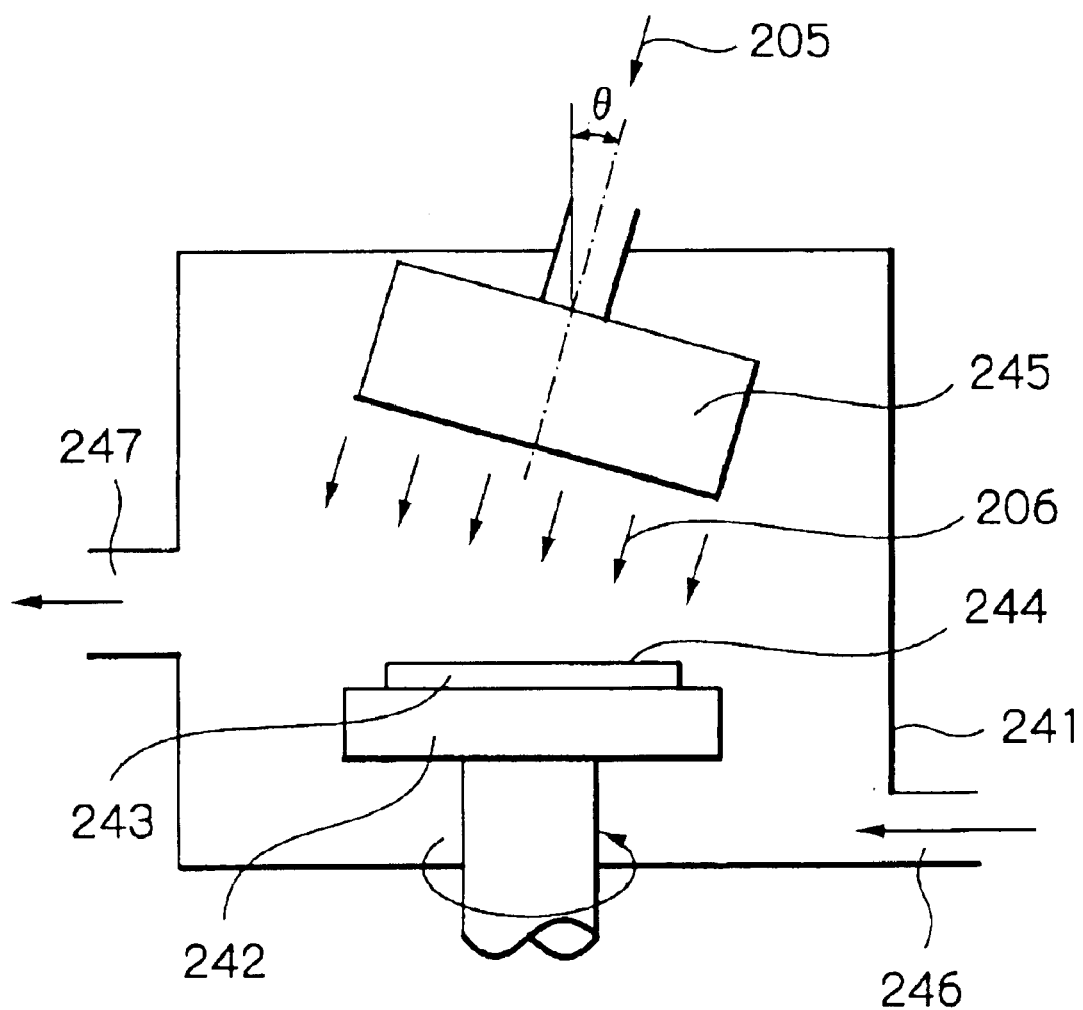
FIG. 18 is a diagram showing a structural example of a fast particle beam irradiation apparatus for producing an interconnect structure according to the present invention.

FIG. 18 is a diagram showing a structural example of a fast particle beam irradiation apparatus for applying the above-described fast particle beam, which is different in configuration from those shown in FIGS. 12 and 13. The fast particle beam irradiation apparatus has a processing chamber 241. The processing chamber 241 is provided with a gas inlet port 246 and an evacuation port 247. The evacuation port 247 is connected to a vacuum evacuation system (not shown) to evacuate the processing chamber 241. In the processing chamber 241, a turntable 242 for mounting a substrate 243 is rotatably installed. A fast particle beam source 245 is provided in an upper part of the processing chamber 241. The fast particle beam source 245 has a central axis that is tilted by a specified angle (θ) from a vertical direction with respect to a surface of the substrate 243. By introducing Ar gas 205 into the fast particle beam source 245, a fast Ar atomic beam 206 is produced to irradiate the substrate 243, which has a film 244 formed on the surface thereof.

As the fast particle beam source 245, a publicly known parallel-plate DC plasma type fast particle beam source (see, for example, the specification and drawings of Japanese Patent Application No. Hei 7-86542) is used. An overall length of this fast particle beam source 245 in a direction of a gas stream is made much shorter than normal (narrow gap type; see, for example, Kai Tokuyama "Semiconductor Dry Etching Techniques" (October 1992, Sangyo Tosho) pp. 241–243, and the specification and drawings of Japanese Patent Application No. 2000-254790), thereby realizing a uniform distribution of plasma, a high plasma density and a reduction in overall size. In this system, further, fast Ar atomic beam 206 is blown into a molecular flow area in the processing chamber 241 from a large number of small hole-shaped nozzles. Therefore, argon atoms fly parallel to each other in the processing chamber 241 and collide with the substrate 243.

As shown in FIG. 18, the turntable 242 with the substrate 243 mounted thereon rotates during processing. Therefore, even if the substrate 243 has minute recesses in the surface thereof, Ar atoms in the fast Ar atom beam 206 reach various portions inside the recesses, including side walls, depths and bottoms of the recesses. Thus, an entire diffusion barrier layer adheres and bonds strongly to an interlayer insulative film as an underlayer. Naturally, the fast particle beam irradiation apparatus shown in FIG. 18 is usable under operating conditions other than the above (for example, under conditions where different gas species and deposition layer materials are used and/or a neutralizing mechanism is required). For example, only Ta is deposited on the surface of the substrate 243 in advance, and $N_2$ gas is supplied in place of Ar, thereby allowing synthesis of TaN and simultaneously inducing a mixing action by a fast nitrogen atom beam. Further, if a source gas is introduced from the gas inlet port 246 shown in FIG. 18, the fast particle beam irradiation apparatus can perform the same function (film deposition and mixing) as that of the deposition apparatuses shown in FIGS. 12 and 13.

Figure 19:
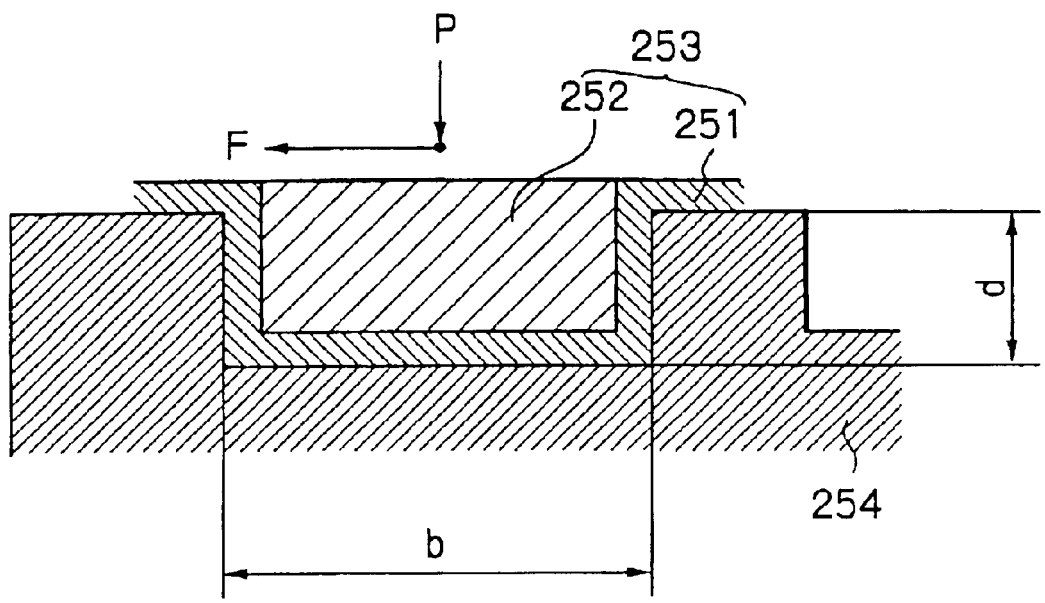
FIG. 19(a) is a schematic cross sectional view showing an interface between an organic insulating layer and a material filled in a recess formed in the insulating layer.
FIG. 19(b) is a schematic cross sectional view showing a model of interface peel that may occur during a chemical/mechanical polishing (CMP) process for polishing a deposited film.
Figure 19B:
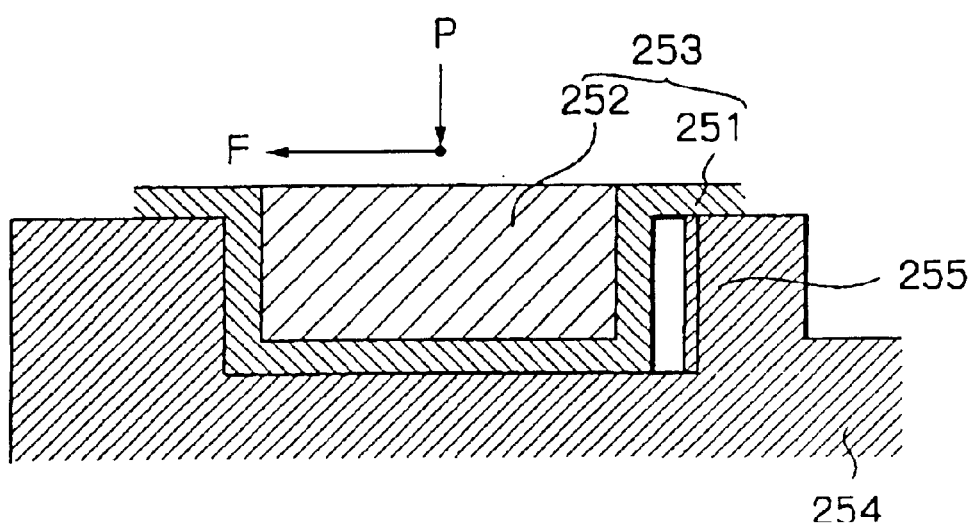

To estimate a necessary value for adhesion (bond) strength of a deposited film, let us imagine a simple model by assuming, as shown in FIG. 19(a), a gap fill element 253 as an interconnect portion of a semiconductor device. The gap fill element 253 comprises a two-dimensional diffusion barrier layer 251 of width b and height d, which has a unit thickness, and a conductive path 252. Let us assume that the gap fill element 253 peels uniformly at a side wall surface as shown in FIG. 19(b) during a chemical/mechanical polishing process by receiving transverse polishing frictional force F from a rotary polishing table (not shown). In FIGS. 19(a) and 19(b), reference symbol P denotes a mean contact surface pressure acting on the rotary polishing table. Reference numeral 254 denotes an organic insulating film layer formed on a surface of a substrate (not shown). Reference numeral 255 denotes a portion of the diffusion barrier layer 251 peeled from the organic insulating film layer 254.

In FIGS. 19(a) and 19(b), when the mean contact surface pressure P acts on the rotary polishing table, the polishing frictional force F acts on the gap fill element 253 with a unit thickness so as to move the element 253 transversely. The polishing frictional force F is given by the following equation (1):

$$F = \mu P b \quad (1)$$

where $\mu$ represents a mean friction coefficient.

Assuming that resistance force [=adhesion (bond) strength] acting per unit area, when a side surface of the diffusion barrier layer 251 is uniformly separated by the polishing frictional force F, is $\sigma$ and a contribution of adhesion at a bottom surface is ignored, the following equation (2) holds:

$$F = \sigma d \quad (2)$$

From Eqs. (1) and (2), $\sigma$ is expressed in the form of the following equation (3):

$$\sigma = \mu P b / d \quad (3)$$

For safety, let $\mu$ be 0.3, and the mean contact surface pressure P is assumed to be 10 kgf/cm² as a maximum estimated value in an actual machine. An aspect ratio is assumed to be d/b=1/4 as a minimum estimated value. On this assumption, $\sigma$=13.5 kgf/cm² is obtained from Eq. (3). In other words, adhesion strength between the organic insulating film layer 254 and the diffusion barrier layer 251 needs to be at least 13.5 kgf/cm². During peeling, strictly speaking, separation along an interface starts from a local region (weakest portion) of a joint area between the two layers 254 and 251. A peel load is smaller than a force required for the interface between the organic insulating film layer 254 and the diffusion barrier layer 251 to separate all at once in a vertical direction as in the model shown in FIGS. 19(a) and 19(b). Here, it is supposed for explanatory simplicity that all regions of the interface separate simultaneously, as stated above.

Figure 7:
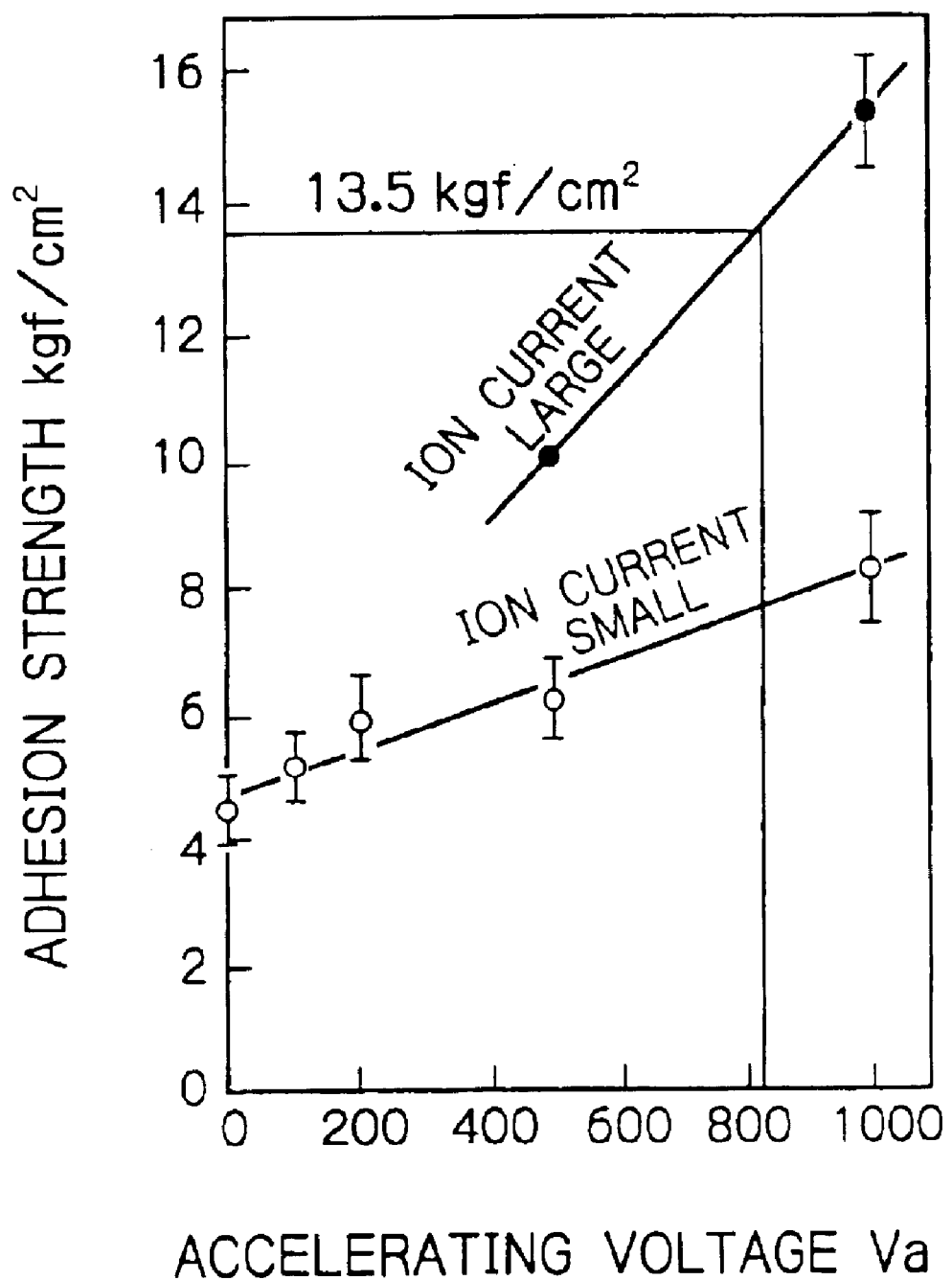
FIG. 7 is a diagram showing a relationship between adhesion (bond) strength of polyethylene to a Si substrate and an ion accelerating voltage.
Figure 8:
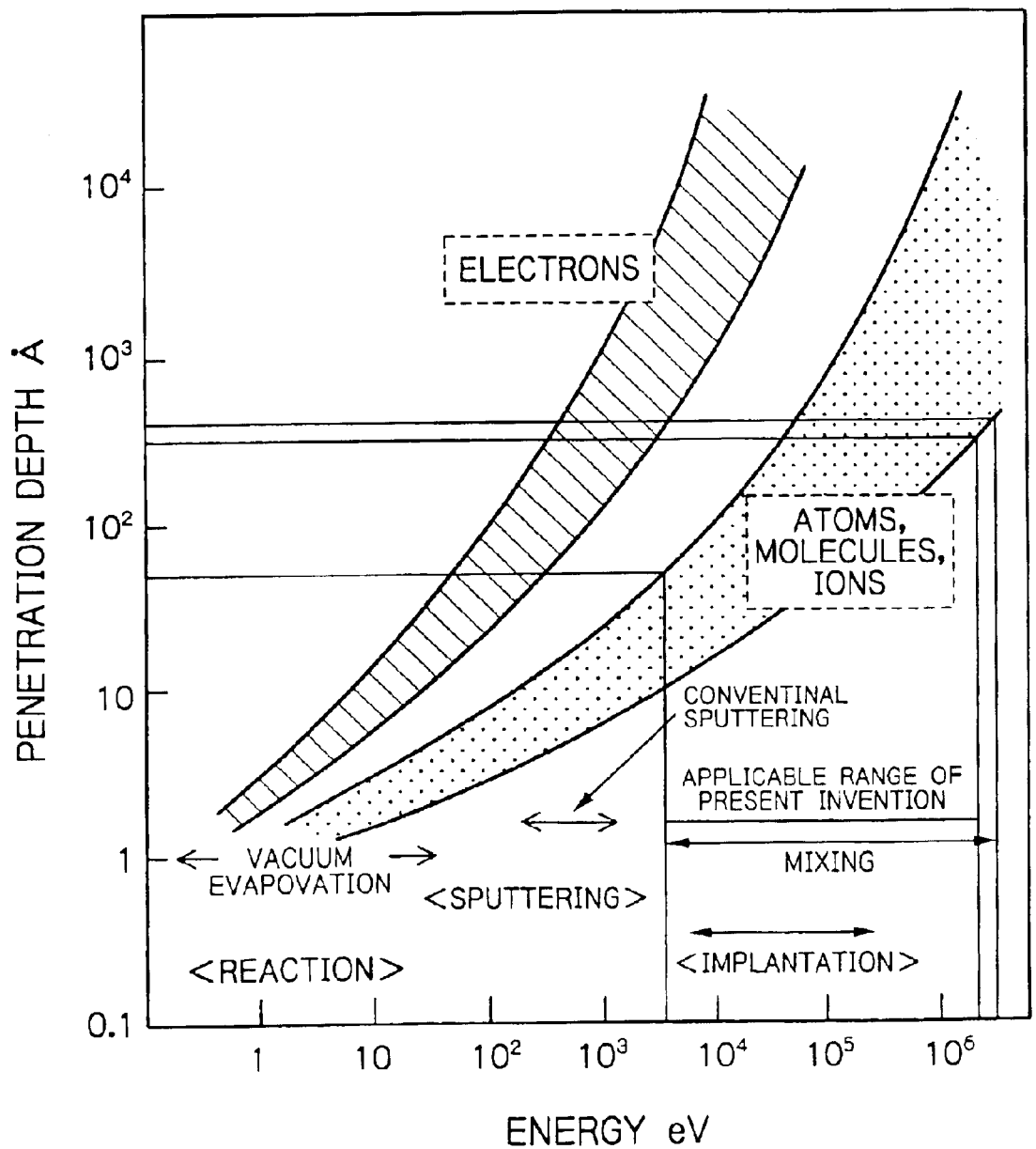
FIG. 8 is a diagram showing a relationship between penetration depth of particles into a substrate when the substrate is irradiated with a fast particle beam and particle energy of the fast particle beam, in which principal surface phenomena are noted.

In conclusion, it will be understood with reference to FIG. 7 that an accelerating voltage needs to be at least 800 V (at least 800 eV in terms of particle energy) in order to obtain necessary adhesion (bond) strength by making use of mixing. On the other hand, it is convenient to set a particle energy upper limit at 2 MeV with a view to lessening damage to semiconductor devices, although a maximum energy at which a mixing action takes place is of the order of 3 MeV, as will be clear from FIG. 8. It will be understood from the foregoing discussion that a range of desirable particle energy values is from 800 eV to 2 MeV.

Figure 20:
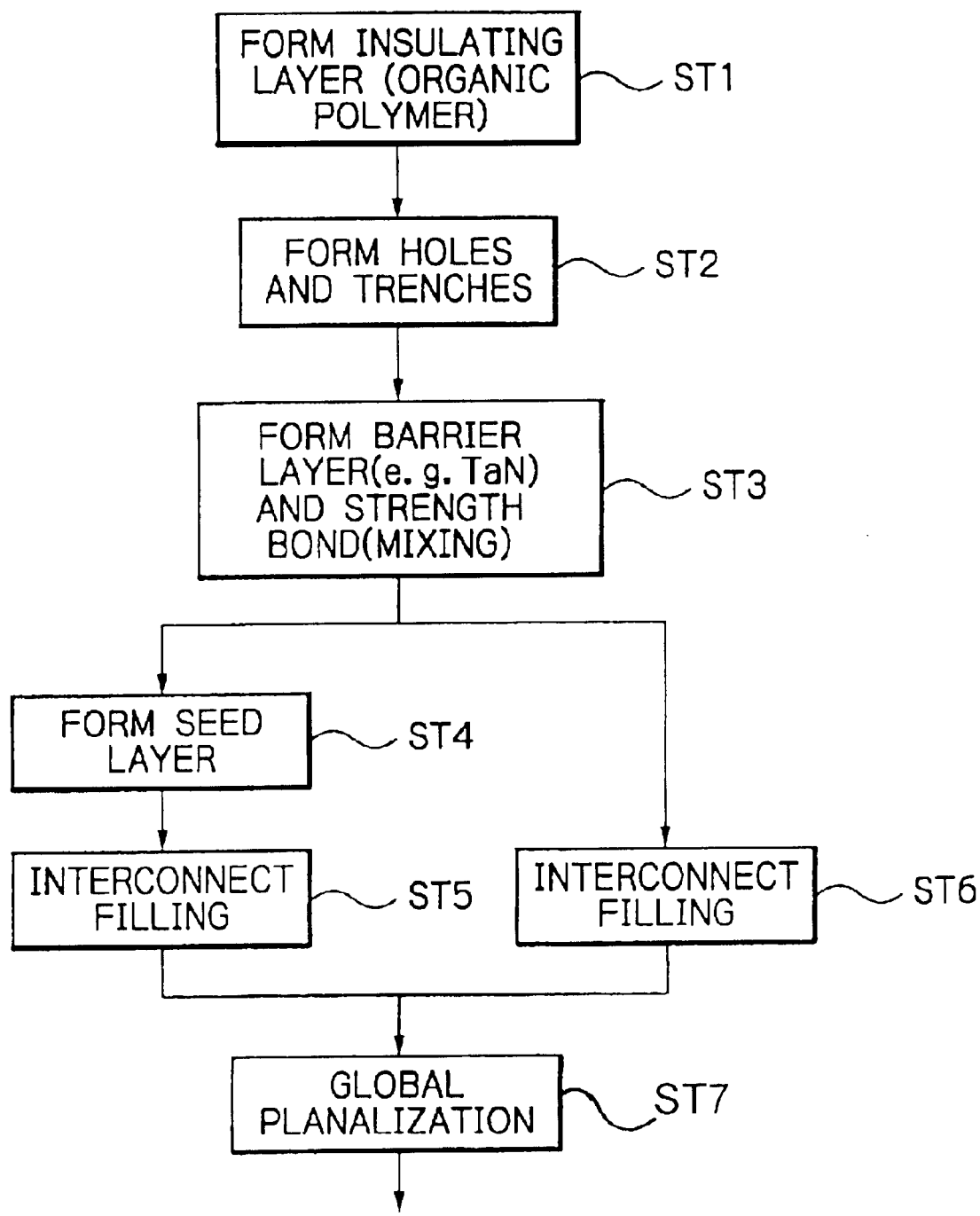
FIG. 20 is a chart showing a flow of a process of producing an interconnect structure according to the present invention.

FIG. 20 is a chart showing flow of a process for producing an interconnect structure according to the present invention. At step ST1, an organic insulating layer of an organic polymer is formed on a surface of a substrate by performing coating or the like of the substrate. Subsequently, holes and trenches are formed in a surface of the organic insulating layer by performing lithography and etching of the insulating layer at step ST2. Next, at step ST3, a diffusion barrier layer of TaN or the like is formed by performing particle beam irradiation with the deposition apparatus shown in FIG. 12. At the same time, a bond between the barrier layer and the organic insulating layer is strengthened (i.e. an area is formed in the vicinity of an interface between the organic insulating layer and the diffusion barrier layer, in which atoms constituting the two layers are mixed together).

Next, at step ST4, a seed layer is formed by performing sputtering, CVD or film deposition according to the present invention. Subsequently, interconnect filling is carried out by plating at step ST5 (i.e. interconnect paths constituting interconnect portions are formed in the holes and trenches covered at surfaces thereof with the seed layer). Alternatively, after the diffusion barrier layer has been formed at the above-described step ST3, interconnect filling is carried out directly by performing reflow sputtering, CVD or film deposition according to the present invention. Whether to proceed from step ST3 to steps ST4 and ST5 or to step ST6 should be decided according to a degree of fineness of the interconnect structure or according to need in actual practice. Upon completion of the above-described interconnect filling, global planarization is carried out by performing chemical/mechanical polishing (CMP) at step ST7.

Although the deposition apparatus shown in- FIG. 12 is used in formation of the diffusion barrier layer at the above-described step ST3 by way of example, it is also possible to use various methods such as those described in connection with FIGS. 13 to 18. The process consisting of the above-described steps ST1 to ST7 is repeated according to a number of interconnect layers.

As has been stated above, in accordance with the embodiments explained with reference to FIGS. 12–20, following advantageous effects will be attainable.

As stated above, a mixing area is formed in the vicinity of an interface between an interlayer insulative film layer and a diffusion barrier layer by fast particle irradiation. In the mixing area, atoms or molecules constituting the interlayer insulative film layer and the diffusion barrier layer are mixed together. Therefore, the interlayer insulative film layer and the diffusion barrier layer are bonded together with a sufficiently high adhesion (bond) strength. Accordingly, it is possible to provide an interconnect structure that is free from peel or dissociation at the interface between the interlayer insulative film layer and the diffusion barrier layer.

Further, the interlayer insulative film layer is made of a material selected from the group consisting of siloxane-based organic compounds and other organic polymers, and a conductive portion is made of copper. Therefore, it is possible to provide an interconnect structure in which peel or dissociation will not occur at an interface between the interlayer insulative film layer and the diffusion barrier layer, an RC delay phenomenon in signal transmission is minimized, and electromigration damage is not realized.

According to the interconnect structure producing method of the invention, the step of forming a diffusion barrier layer in contact with an interlayer insulative film layer includes a film deposition step of depositing a specified element, and a particle beam irradiation step of performing irradiation with a particle beam. The film deposition step and the particle beam irradiation step are carried out simultaneously or individually or alternately. Accordingly, a mixing area in which atoms or molecules constituting the interlayer insulative film layer and the diffusion barrier layer are mixed together is formed in the vicinity of an interface between the two layers. Consequently, the interlayer insulative film layer and the diffusion barrier layer are bonded together with a sufficiently high adhesion (bond) strength. Therefore, it is possible to provide an interconnect structure that is free from peel or dissociation at the interface between the interlayer insulative film layer and the diffusion barrier layer.

Further, the particle beam irradiation step is carried out with particle energy in the range of from 800 eV to 2 MeV. Therefore, a mixing area in which atoms or molecules constituting the interlayer insulative film layer and the diffusion barrier layer are mixed together is formed satisfactorily in the vicinity of the interface between the two layers. Moreover, there is no likelihood that the particle energy will damage the device.

In connection with the embodiment shown in FIG. 18, another aspect of the present invention will be explained hereinbelow. That is, in this embodiment, a collimated particle beam 206 is used and the substrate 243 is rotated while keeping an angle between the surface of the substrate 243 and a direction in which the beam 206 impinges upon the surface constant, whereby an interior of an interconnect (or circuit wiring) pattern recess formed in the surface is appropriately irradiated with the beam so that organic insulating film layer 230 is uniformly formed over an entire surface of the interconnect pattern recess formed in the surface of the substrate.

Figures 21A, 21B:
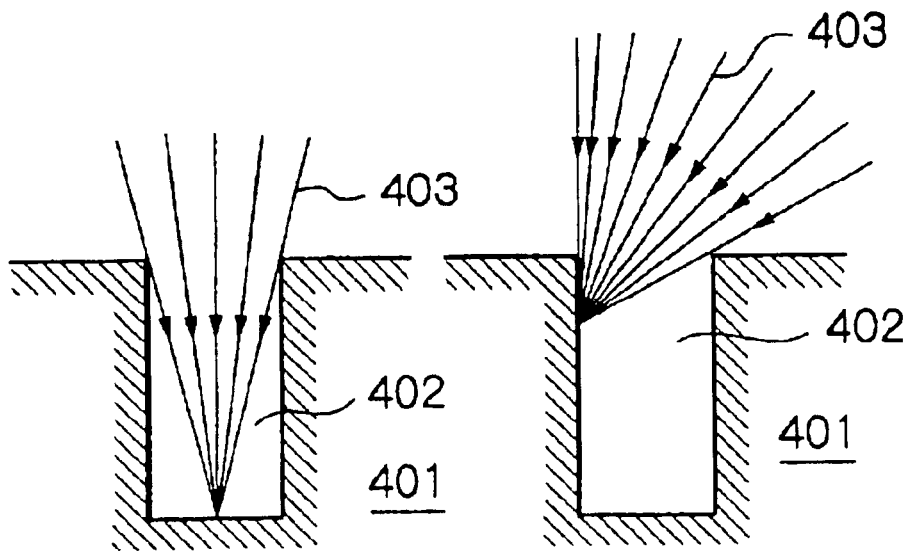
FIG. 21(a) is a schematic cross sectional view showing a mechanism of formation of a coating layer in a recess formed in a substrate according to a conventional vacuum deposition method.
FIG. 21(b) is a schematic cross sectional view showing a mechanism of formation of a coating layer in a recess formed in a substrate according to the conventional vacuum deposition method.
Figures 21C, 21D:
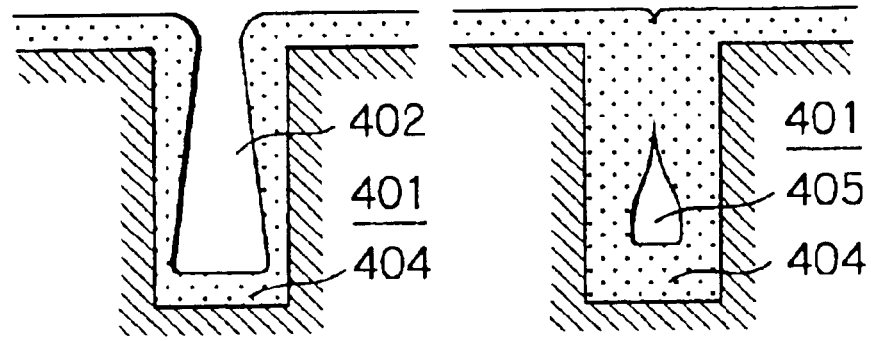
FIG. 21(c) is a schematic cross sectional view showing a coating layer formed in a recess according to the conventional vacuum deposition method.
FIG. 21(d) is a schematic cross sectional view showing a coating layer formed in a recess according to the conventional vacuum deposition method in which a void is formed in a portion of the layer filled in the recess.
Figures 21E, 21F:
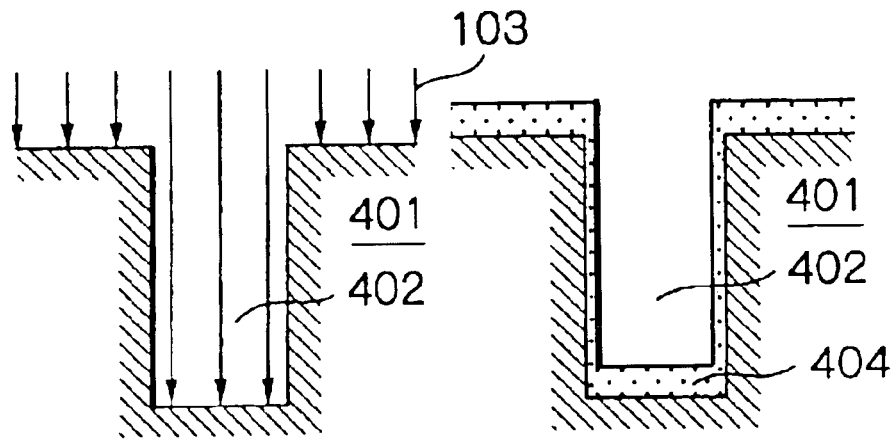
FIG. 21(e) is a schematic cross sectional view showing a mechanism of formation of a coating layer over a surface provided with a recess by using a collimated particle beam of a coating material in a conventional vacuum deposition method.
FIG. 21(f) is a schematic cross sectional view showing a coating layer formed over the surface by using the collicated particle beam.

This aspect of the present invention is applicable to a vapor vacuum deposition method used for coating a surface of a substrate. With reference to FIGS. 21(a)–21(d), there is shown a manner in which a surface of a substrate provided with an interconnect pattern recess 402 is coated by virtue of conventional vacuum vapor deposition. As shown in FIGS. 21(a) and 21(b), in a conventional vacuum vapor deposition method, particles of a coating material are supplied in a non-collimated beam form, whereby many particles impinge on a surface of the recess near an entrance opening of the recess and, thus, a number of particles which reach a bottom portion of the recess becomes small so that a coating layer formed on the surface of the recess grows rapidly around the entrance opening of the recess as compared with that formed around the bottom portion of the recess (FIG. 21(c)). Accordingly, when coating has proceeded to such an extent that the recess is filled with coating material, a void might be formed in the coating material filled into the recess. In order to avoid such a formation of a void, there has been made a proposal that coating particles are directed to a surface of a substrate as a collimated beam in a direction normal to the surface (FIG. 21(e)). However, in such a case, since few particles impinge on a side wall of the recess, a coating layer does not grow on the side wall (FIG. 21(f)).

Figure 22:
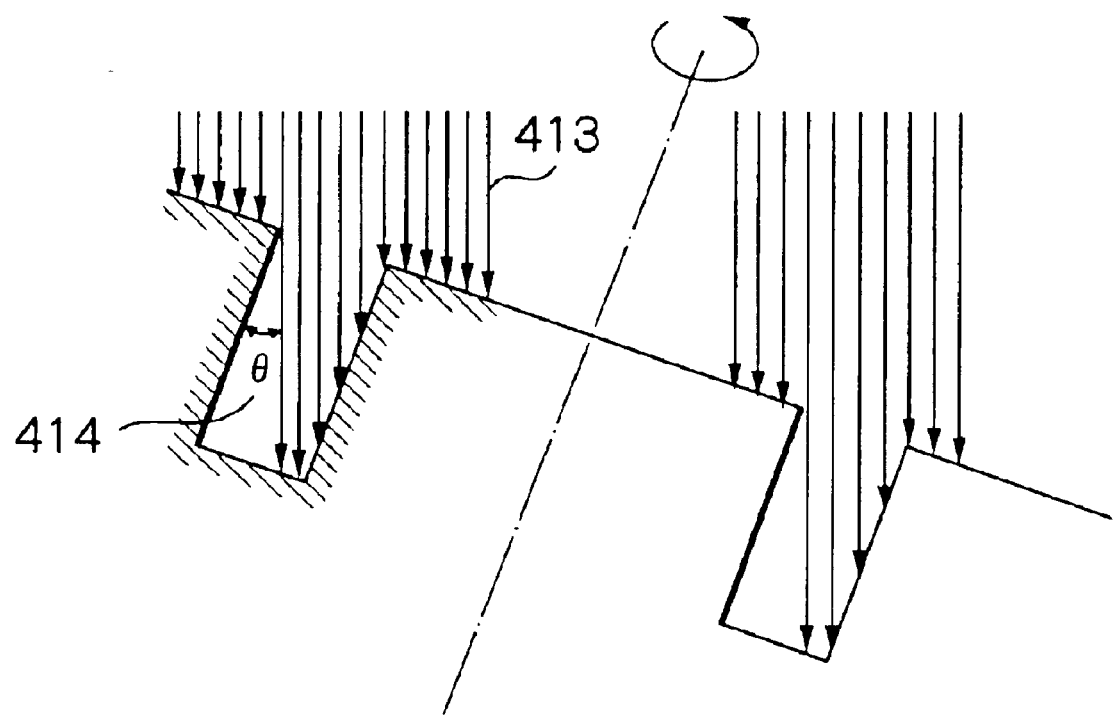
FIG. 22 is a schematic cross sectional view showing a coating method in accordance with the present invention.

The present invention solves such a problem by employing a particle beam application method similar to that in the embodiment of FIG. 18. That is, as shown in FIG. 22, a coating material is supplied as a collimated particle beam 413, and a substrate is inclined, relative to a direction in which the beam is directed, at a predetermined angle and is rotated about an axis parallel to this beam direction. Upon a full revolution of the substrate about the axis, an entire side surface of recess 414 is irradiated with the particle beam, whereby the problems stated with reference to FIGS. 21(a)–21(f) are solved. In order to enable the beam to reach a bottom surface of the recess, inclination angle $\theta$ of a surface of the substrate relative to the beam direction is set as follows:

$$|<\theta<\theta_0(=\tan^{-1}(A/2B))$$

wherein A is a mouth width of the recess and B is a depth of the recess.

However, presuming that the beam is not perfectly collimated, even if $\theta_0$ is made larger, some amount of particles may reach the bottom surface of the recess.

Figures 23A, 23B, 23C:
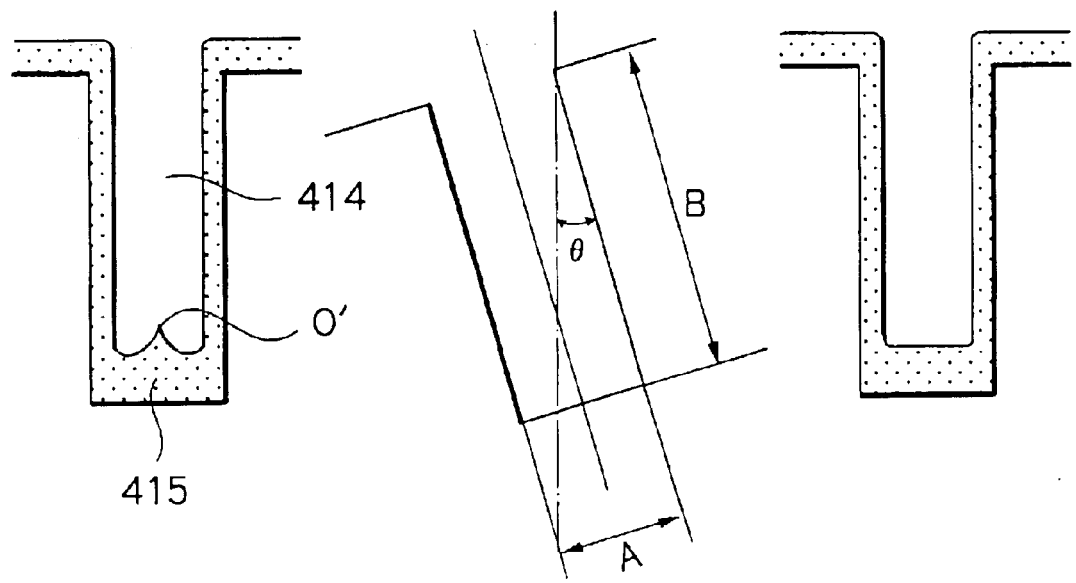
FIG. 23(a) is a schematic cross sectional view showing a defect formed in a coating layer which might be caused in a coating method according to the present invention.
FIG. 23(b) is a schematic drawing showing a way to avoid the defect in the coating layer as shown in FIG. 23(b)
FIG. 23(c) is a cross sectional view showing a coating layer formed on a surface having a recess according to the present invention.

If coating is effected with the inclination angle $\theta$ of $\tan^{-1}(A/2B)$, there is a tendency that at a center of the bottom surface the coating layer becomes thick as compared with that at other portions. To avoid such a tendency, the inclination angle $\theta$ is set as being $$\tan^{-1}(A/2B)<\theta<\tan^{-1}(A/B), \text{ and,}$$

if being set at around the above-noted upper limit, i.e., $\tan^{-1}(A/B)$, a coating layer of a uniform thickness will be formed across an entire bottom surface of the recess (FIG. 23(c)). Further, taking into account "re-sputtering" to be mentioned later, it is preferable to set the inclination angle of the surface of the substrate to fall within a range of $0°$-$\tan^{-1}(A/B)$.

Figure 24:
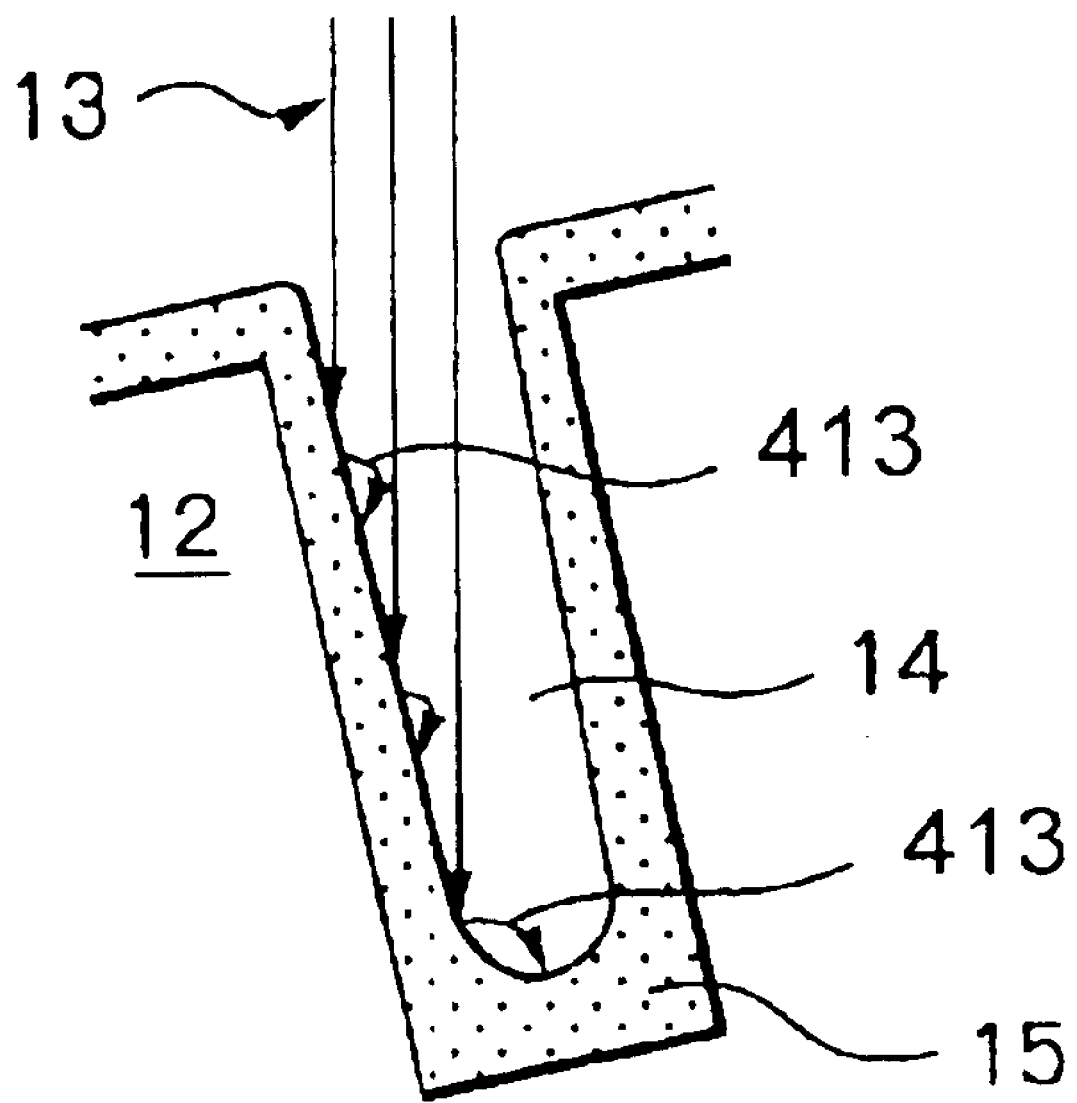
FIG. 24 is a schematic cross sectional view showing a "reflow" which may be caused in a process of forming a coating layer formed on a side wall of a recess.
Figure 25A:
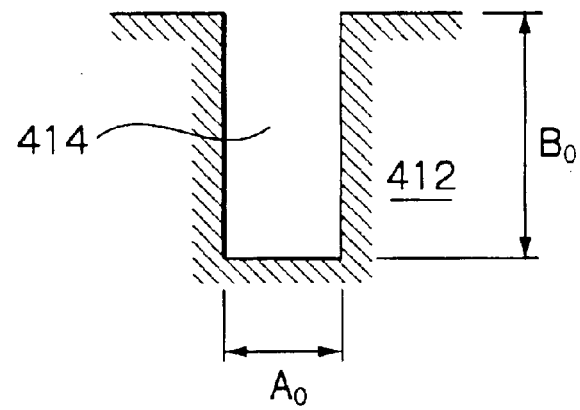
FIGS. 25(a)–25(d) are cross sectional views showing a method of coating a surface of a substrate in sequential order according to the present invention.
Figure 25B:
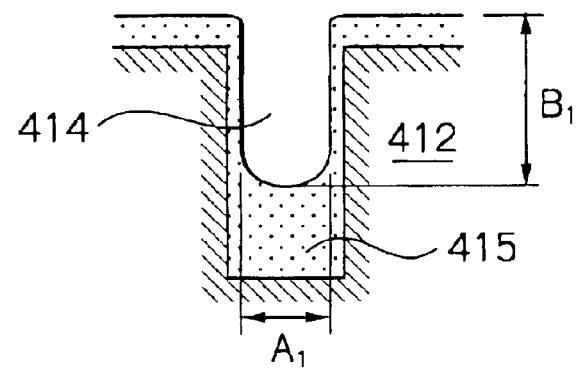
Figure 25C:
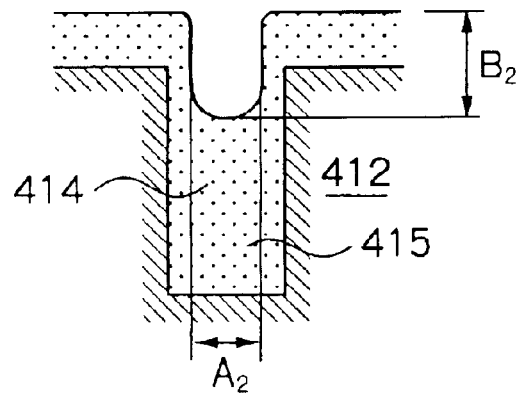
Figure 25D:
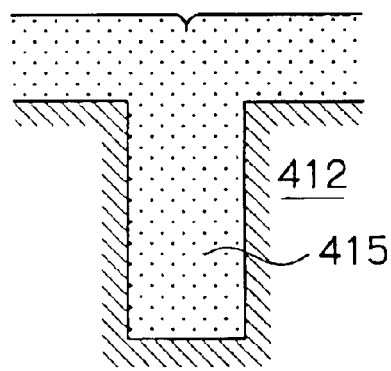

The above-noted discussion is based on an assumption that all particles impinging the surface of the recess adhere to the surface at a position of impingement, and that there is no sputtering phenomenon in which particles which have once adhered to the surface are collided with other particles so as to be forced to be dissociated from the surface and displaced to another position on the surface. However, it is considered that sputtering actually is, as shown in FIG. 24, likely to occur, although a degree of sputtering differs depending on various conditions including energy of collision between particles, a material forming the substrate, and a kind of the particles. In a case that such sputtering occurs at a high level, many particles which were once deposited on a side wall are likely to be displaced towards a bottom of a recess and, thus, even if the inclination angle is set large so that a particle beam cannot directly reach a bottom surface of the recess, the bottom surface will be coated with such displaced particles 413'. Sputtering may take place when energy of an impinging particle is more than a threshold of 30–50 eV (see "Sputtering Coating" by Haruhito Kobayashi published by Nikkan Kogyo Shinbunsha in April, 1998). While a rate of occurrence of sputtering increases as energy of an impinging particle increases, and becomes maximum when the energy of the impinging particle is around 30 keV, it decrease when the energy of the impinging particle exceeds a maximum value. From a such viewpoint, it is noted that the energy of an impinging particle should be set within a range of 30 eV–30 keV.

Figure 26:
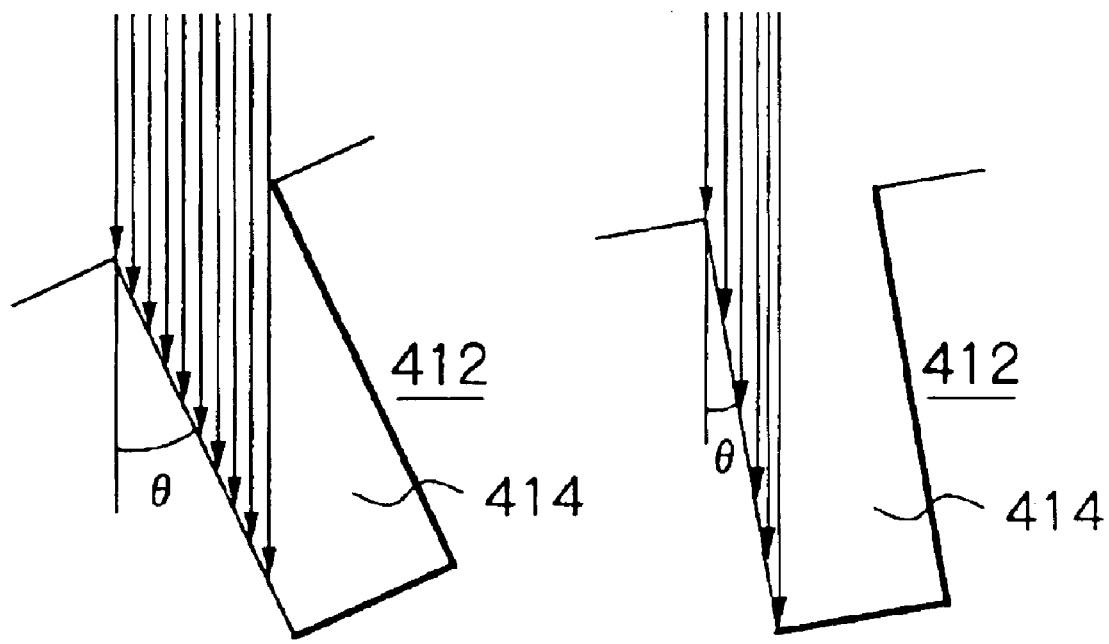
FIG. 26 is a schematic drawing illustrating a relationship between an inclination of a surface of a substrate relative to a source material beam supply direction and an amount of coating material particle beam entering a recess formed in the surface of the substrate.
Figure 29A:
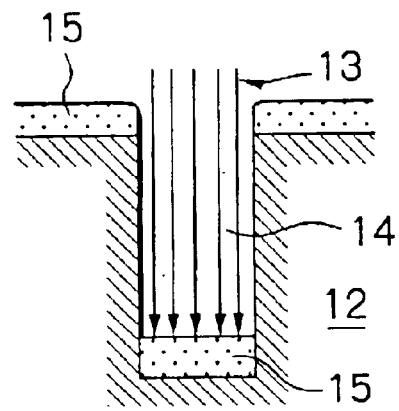
FIGS. 29(a)–29(d) are cross sectional views showing a method of coating a surface of a substrate in sequential order according to the present invention.
Figure 29B:
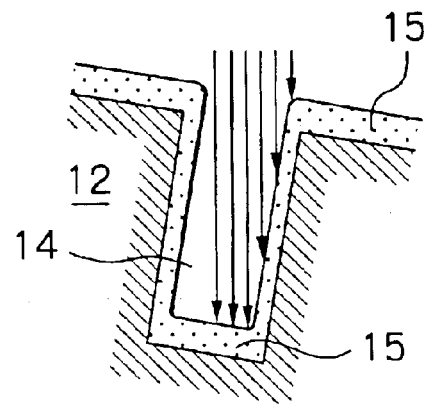
Figure 29C:
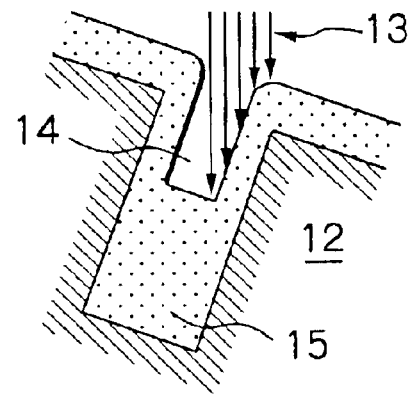
Figure 29D:
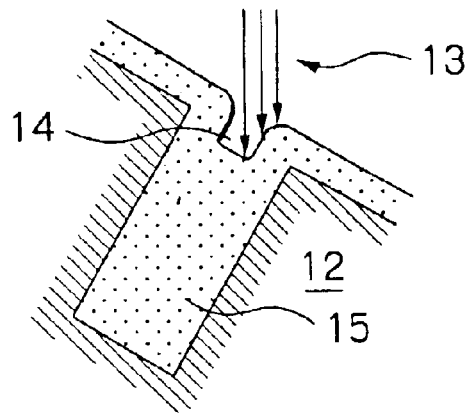

FIG. 25(a)–FIG. 25(d) and FIGS. 29(a)–29(d) show progress of formation of a coating layer over a surface of a substrate provided with a recess 414. It is preferable that coating is conducted in a manner as stated below. In summary, at an initial stage, a bottom surface is mainly coated by setting a surface of the substrate to be generally normal to a beam direction, and then an entire surface of the recess is coated by changing an angle of the surface of the substrate relative to the beam direction so that an aspect ratio (i.e., depth/mouth width of the recess: $B_1/A_1$, $B_2/A_2$) is kept generally constant or gradually decreases. As shown in FIG. 26, assuming that a rate of coating over a surface normal to a beam direction is "V", a rate of coating over a side wall of recess 414 of substrate 412 having an inclination angle θ becomes "V sin θ". This means that rate of coating over the side wall of the recess increases as the inclination angle θ increases. Thus, in a case that particles forming a coating layer over a side wall of a recess are subject to a so-called "reflow" or particle (or layer material) shift towards a bottom of the recess by, for example, sputtering as mentioned above, it is possible that coating or filling of the recess is effected at a high rate by adjusting inclination angle θ so as to be large without danger of formation of a void in a coating layer filled in the recess, as mentioned with reference to FIG. 21(d). FIGS. 27(a) and 27(b) show progress of formation of coating in recess 414 of substrate 412, which proceeds accompanying the above-stated "reflow". This coating method can apply to formation of a copper interconnect (or circuit wiring) structure on a semiconductor substrate 511 as shown in FIG. 28, wherein the structure comprises a barrier layer 515, a seed layer 517 and a copper interconnect layer 516.

In the above-stated coating method, a collimated beam is arranged taking into consideration the following matters. For example, assuming that in a nitrogen atmosphere with a pressure set to be 0.1 Pa, a nitrogen molecule can fly through a straight path of about 66 mm without colliding with another nitrogen molecule. In other words, a nitrogen molecule has a mean free path of about 66 mm. As pressure of the atmosphere decreases, the mean free path increases. Specifically, when the pressure decreases to 0.01 Pa, the mean free path becomes 660 mm. In the coating method of the present invention, a particle beam is arranged such that particles reach a surface of a substrate through their mean free path without substantial collision between the particles.

The present invention further provides a method and apparatus for conducting dry etching, in particular, an anisotropic etching which is suitable for forming a fine pitch copper interconnect (or wiring) pattern in a semiconductor substrate.

Figures 30, 31:
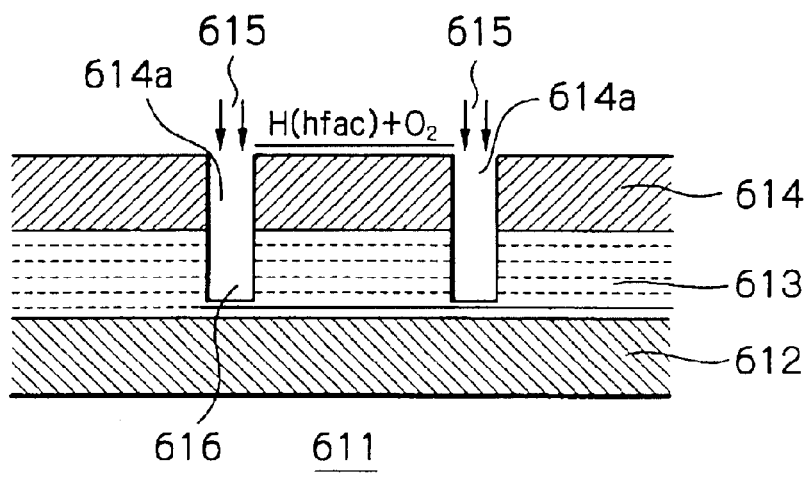
FIG. 30 is a cross sectional view of a semiconductor substrate which has been subjected to anisotropic etching according to the present invention.
FIG. 31 is a table showing exemplary combinations of etching gases and particle beams.

Following is an explanation of an anisotropic etching method in accordance with the present invention. FIG. 30 is a conceptual drawing illustrating the anisotropic etching method. In this figure, a substrate is defined by an Si substrate 611, an insulation layer ($SiO_2$) 612 and a Cu interconnect (or wiring) layer 613 are formed on a top of the Si substrate 611, and, further, a resist layer 614 provided with an interconnect or wiring pattern aperture 614a is formed on a top of the wiring layer 613.

Anisotropic etching is carried out by bringing a mixture of H(hfac) gas and $O_2$ gas into contact with the substrate, while at the same time applying radiation of $Ar^+$ ion or Ar radical beam 615 to a surface of the resist layer 614 on the Si substrate 611. The Cu interconnect layer 613 is etched through the aperture 614a of the resist layer 614 in a vertical direction.

In this etching process, when the H(hfac) gas and $O_2$ gas adsorbed on a surface, or staying in a gas phase in the vicinity of the surface, of the substrate (Cu interconnect layer 613) is exposed to the radiation of $Ar^+$ ions or Ar atoms, and further pressure of gas phase and energy of particles in the radiation beam is adjusted appropriately, an amount of deposition of component elements of the gas, staying in the gas phase, to the substrate surface can be increased, and at the same time reactivity in an exposed region of a substrate surface can be enhanced by energy imparted to the gas and the Cu wiring layer 613 and sputtering occurring in the exposed region of the substrate surface. A relatively active reaction occurs in a region of the Cu wiring layer 613 having higher radiation beam density of $Ar^+$ ions or Ar atoms (a bottom portion of cavity 616), as compared with in a side wall portion of the cavity, which allows anisotropic etching to proceed.

Although the mixture composed of H(hfac) gas and $O_2$ gas is used as an etching gas in FIG. 30, application is not limited to this but, for example, as shown in FIG. 31, the H(hfac) gas may be used solely as the etching gas in combination with a radiation beam 615 of oxygen ions or oxygen radicals applied to a substrate.

Figure 32:
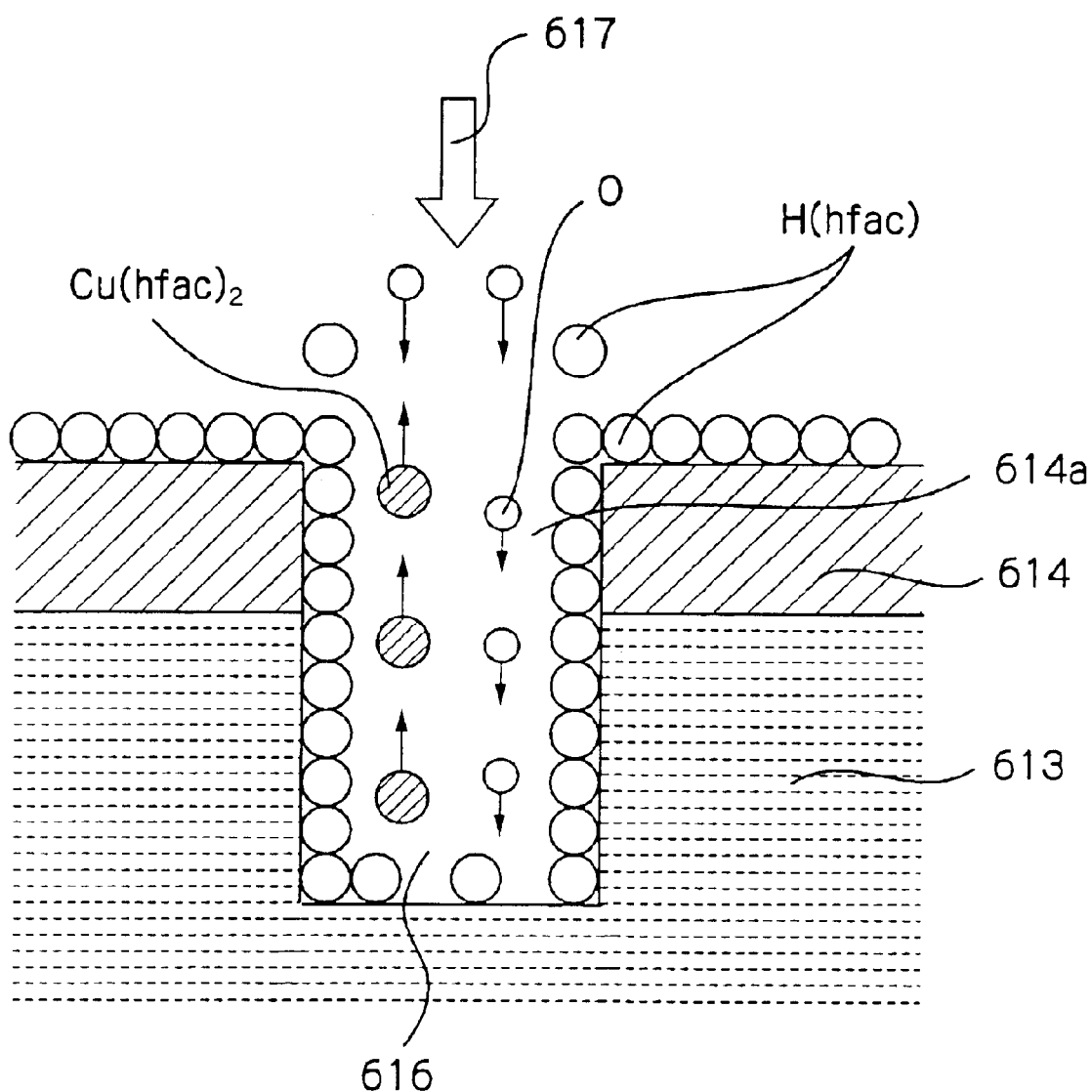
FIG. 32 is a schematic cross sectional view showing a mechanism of anisotropic etching in accordance with the present invention.

FIG. 32 is a conceptual drawing illustrating an etching process according to the combination shown in FIG. 31. When beam 617 of oxygen ions or oxygen radicals is irradiated and at the same time the H(hfac) gas is supplied as described above, then it turns out that oxygen is intensively supplied to a region having higher radiation beam density on a surface where H(hfac) molecules are absorbed, which consequently causes a reaction defined as $Cu \rightarrow Cu_2O \rightarrow Cu(hfac)_2$ limitedly in a bottom portion of cavity 616 to cause anisotropic etching to proceed on Cu wiring layer 613. FIG. 32 is different from FIG. 30 in that energy for reaction is given by the beam 617 of oxygen ions or oxygen radicals.

In this regard, the above reference [Tomoaki Koide et al. 30P-YA-16 in "The proceedings of the 47th Applied Physics Related Association Lecture Meeting" ('00.3)] has suggested that, as regards a procedure for bringing a substrate into contact with gas in a case where H(hfac) gas and oxygen are used as an etching gas, preferably the H (hfac) would be solely introduced at first and then the oxygen is added. This is considered to be due to a faster reaction, which could be accomplished when the H(hfac) is allowed to be adsorbed on a surface of Cu wiring layer 613 first, and then the oxygen is supplied later since conversion of substance defined in the following equation (3) proceeds concurrently triggered by effect of excessive existence of H(hfac).

$$Cu \rightarrow Cu_2O \quad Cu_2O \rightarrow Cu(hfac)_2 \qquad (3)$$

Although it has been considered that a temperature (170° C.) as high as that for Cu-CVD is appropriate for inducing a reaction by, as a substitute for particle energy, only by applying heat, the above combination of the H(hfac) gas and the beam 617 of oxygen ions or oxygen radicals makes it possible for fast etching to be carried out by the above-mentioned mechanism while controlling generation of residues by yielded substances without using any heat-up mechanism. Further, since the reaction occurs significantly actively in the bottom portion of the cavity 616 as compared with that at the side wall of the cavity when the oxygen beam is used, based on the same principle as in the case when an Ar beam is used, anisotropy in etching can be accomplished.

As having been described, using the above method for etching a substrate makes it possible to perform anisotropic dry etching of Cu, which otherwise would be practically unfeasible in the prior art.

Figure 33:
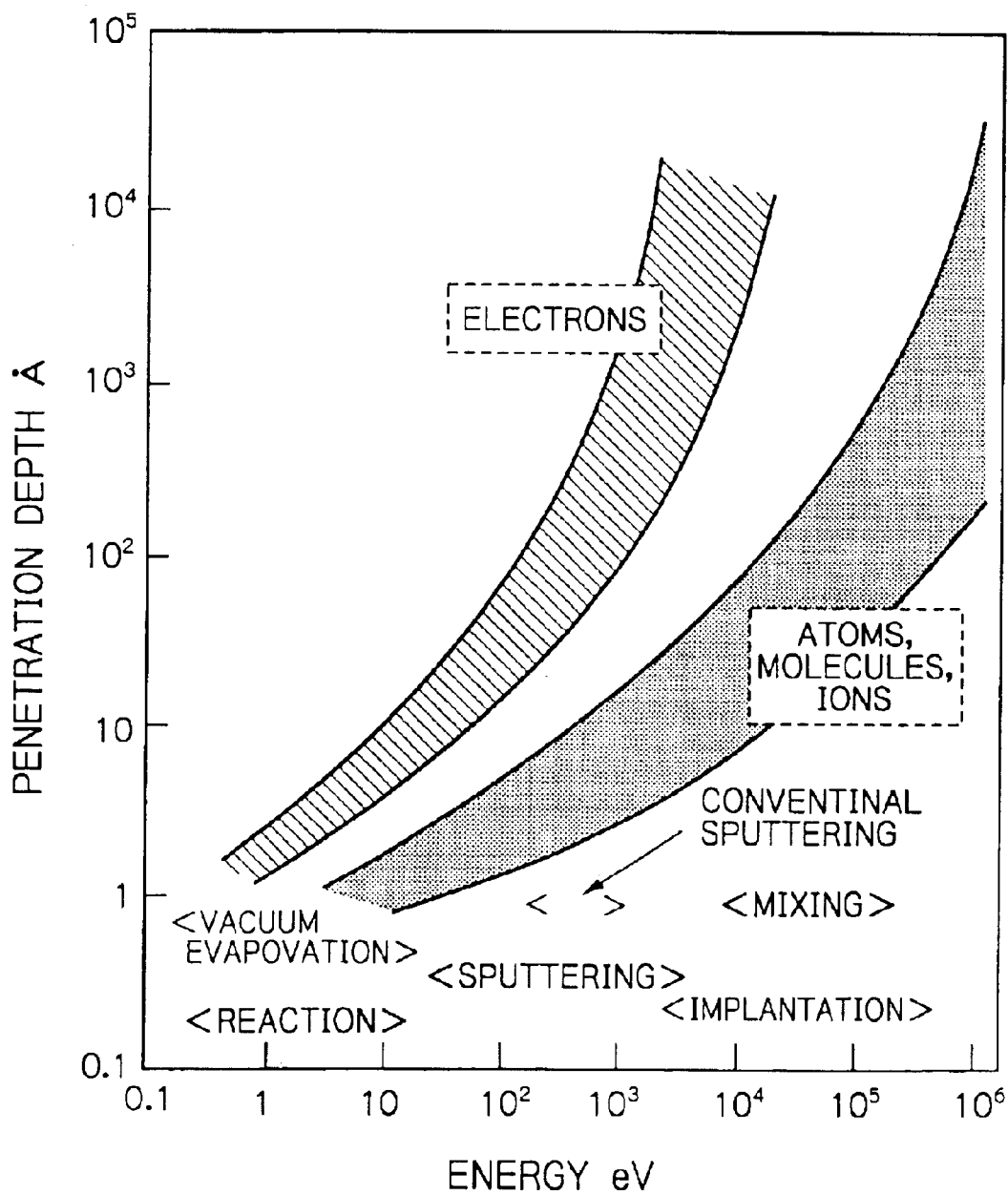
FIG. 33 is a diagram similar to that of FIG. 11.

Preferably, the particle energy should be within a range of 200 eV to 1 keV. A reason for that is described below. FIG. 33 is a diagram illustrating a relationship between particle energy and a penetration depth of a particle beam as well as those dominant phenomena occurring in an exposed surface of a substrate. When sputter cleaning (i.e. physical etching)

is performed on the surface of the substrate using a normal sputtering device, Ar ions having energy of approximately 200 to 1,000 eV are utilized as a sputtering gas (see FIG. 33). That is, it could be appreciated that use of Ar ions having energy in the range causes sputtering of atoms in the surface of the substrate.

In this regard, sputtering onto a copper surface using, for example, Ar ions of 1,000 eV with an ion current density of 0.85 mA/cm$^2$ results in a measured etching rate of approximately 34 nm/min, which is extremely slow [P. 233 in "The practical Auger Electron Spectroscopy" edited by Ryuichi Shimizu and Kazuhiro Yoshihara, first edition in June, 1989 by Kyoritsu Publication Co., Ltd]. Accordingly, if application is limited to a purpose of dry-cleaning of the surface (i.e. surface decontamination), Ar ion etching may be useful, but it is extremely inefficient for this technology to be used for sharpening the surface into a desired shape and for creating a cavity. In brief, due to its extremely slow etching rate, there would be no possibility for Ar ion etching to be applied in practice to a processing apparatus for mass production.

It should be noted, when uniformity within the surface becomes problematic, which may be caused by an electro static charging on the substrate side or a dispersion of ions caused by mutual repulsion thereof when ion beam radiation is applied, radiation of a neutral molecular or atomic beam might be used instead of the ion beam radiation.

A typical value for a physical etching rate obtained by using solely Ar ions, which has conventionally been applied mainly in research, is approximately 30 nm/min as described in the above reference [P. 233 in "The practical Auger Electron Spectroscopy" edited by Ryuichi Shimizu and Kazuhiro Yoshihara, first edition in June, 1989 by Kyoritsu Publication Co., Ltd], and that is significantly slow in comparison with a rate of about 400 nm/min obtained easily by reactive etching (RIE) performed in a semiconductor manufacturing process.

As described above, when a copper surface is etched by using the method for anisotropic etching of a substrate according to the present invention, a doubled etching effect is obtained by; 1) etching caused by chemical action of H(hfac) gas; and 2) etching caused by physical action of Ar ions, which take effect at the same time.

Figure 5:
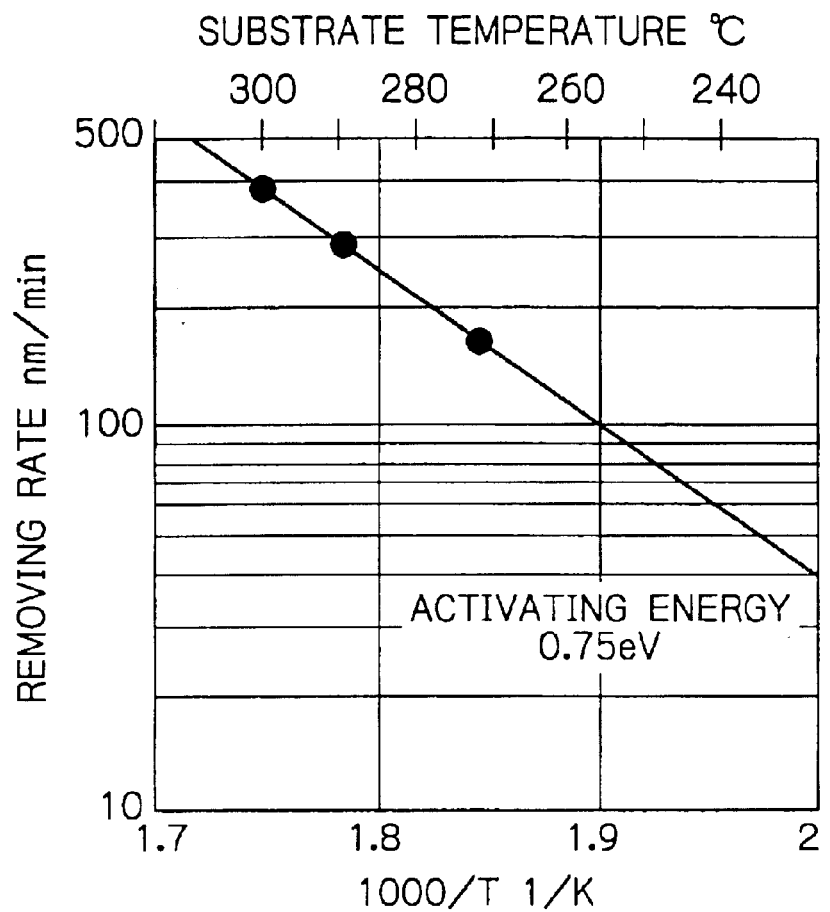
FIG. 5 is a diagram illustrating an example of actual measurement of a removal rate of Cu by H(hfac)+$O_2$ gas.

As discussed above, when temperature of a substrate is set to 300° C., as shown in FIG. 5, an etching rate of about 400 nm/min is obtainable for 1) the etching caused by the chemical action, and further when an accelerating voltage for the Ar ions is set to 1,000 V, an etching rate of about 30 nm/min is obtainable for 2) the etching caused by physical action. Accordingly, if both of 1) the etching caused by the chemical action and 2) the etching caused by the physical action concurrently take effect, it may be possible to easily achieve an etching rate equal to or more than ten times as high as an etching rate obtained by using Ar ions only, thus providing a novel effect by way of an anisotropic (directional) etching device for patterning Cu wiring in a semiconductor device.

Further, the anisotropic etching method according to the present invention, in comparison with a typical plasma etching method, has the following advantages. The method of the present invention is different from a typical dry etching (e.g. RIE) in that the former does not require a substrate to be placed in a plasmatic environment and a controlled etching process may be applicable. If the substrate is placed in a plasmatic environment, there may result problems in that the substrate and its surroundings will be contaminated by unnecessary by-products produced from chemical reactions between an etching gas and the substrate and member material, and in that an expected etching action could be disturbed by the etching gas starting to decompose before reaching the substrate.

According to the present invention, a desired etching process can be performed under a condition where the above-mentioned undesired effects associated with plasma are completely eliminated. Further, since the present invention prevents a temperature of a substrate surface from rising excessively, which otherwise might possibly result by applying plasma, another advantage may be provided in that further aggregation and granulation of deposited copper may be avoided. Because of the advantages described above, the method for performing anisotropic chemical etching of a substrate according to the present invention makes it practical to perform anisotropic dry etching on Cu, which has been conventionally considered infeasible, and thus greatly contributes to fabrication of a semiconductor device having a Cu wiring structure.

It should be appreciated that, in the above embodiment, the description has been developed with respect to the example where Cu is etched, but the invention is not limited to etching Cu. That is, provided is an anisotropic dry etching method in which a substrate is brought into contact with a fluid that reacts well with the substrate to compound a gas containing a component element of the substrate by way of chemical reaction therebetween, thereby allowing a surface of the substrate to be sequentially removed, and accordingly, a material other than Cu may be used in so far as activity can be locally enhanced to allow anisotropic etching to be performed by using an organic gas for the fluid that reacts well with the substrate, and additionally applying to a desired region of a substrate surface at least one beam selected from the group consisting of an ultraviolet beam or a laser beam, an electron beam or a charged particle beam, and an atomic beam or a molecular beam. Further, depending on material of the substrate, an inorganic gas other than the organic gas may be used.

Figure 34:
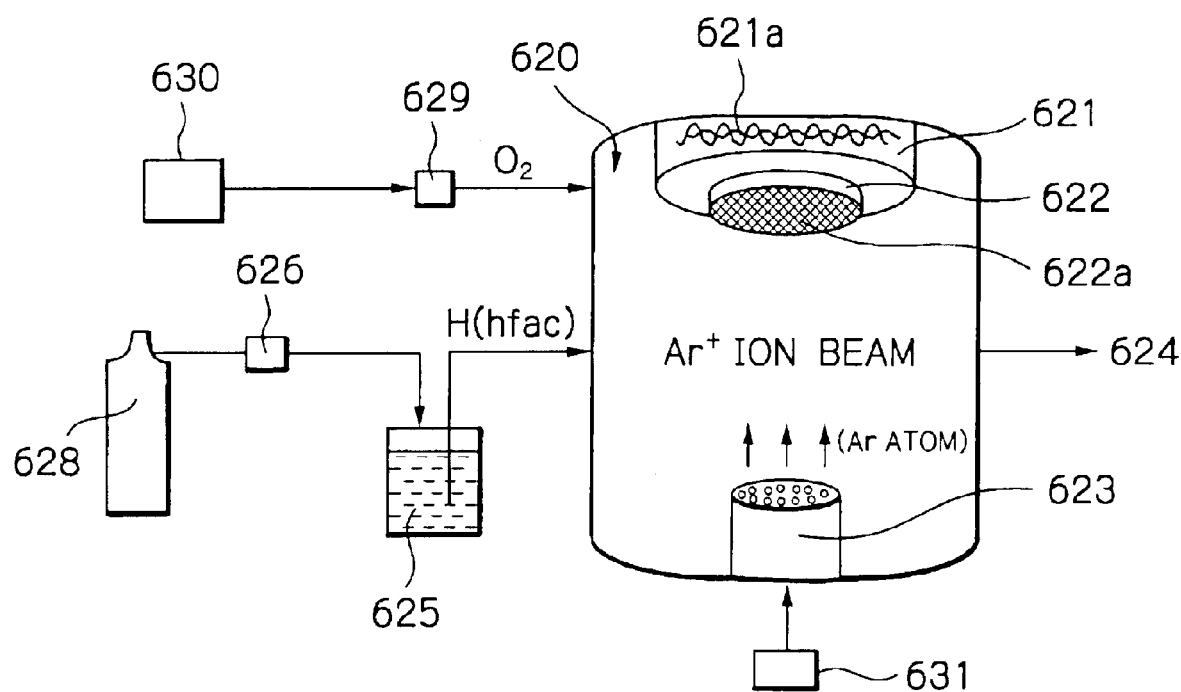
FIG. 34 is a schematic drawing showing an exemplary configuration of a coating apparatus in accordance with the present invention.

FIG. 34 is an exemplary drawing illustrating a conceptual configuration of an anisotropic etching apparatus for performing an anisotropic etching method for a substrate according to the present invention. In FIG. 34, reference numeral 620 generally designates a reaction chamber, and a substrate 622 is supported by a susceptor 621 and is mounted in an upper portion of the reaction chamber 620. The substrate 622 may be, for example, such a substrate as shown in FIG. 30, comprising insulation layer 612, Cu wiring layer 613, and resist layer 614 with a wiring processing pattern formed thereon, with each layer being sequentially deposited one on another on a surface of Si substrate 611. In FIG. 34, the substrate is mounted such that a resist layer 622a formed on a surface of the Cu wiring layer of the substrate 622 is directed downward. It is to be noted that a heating/cooling mechanism 621a for heating/cooling is arranged within the susceptor 621.

A fast ion generating mechanism 623 for generating an Ar$^+$ ion beam or an Ar atom beam is disposed in a lower portion of the reaction chamber 620 so as to face the resist layer 622a. The reaction chamber 620 is coupled to a vacuum evacuation system 624. Reference numeral 625 designates an H(hfac) container for storing H(hfac) gas, and the H(hfac) container 625 is connected with a He reservoir 628 for storing He gas via a mass flow controller (MFC) 626. The reaction chamber 620 is designed to be supplied with the H(hfac) gas by supplying He gas from the He reservoir 628 to the H(hfac) container 625 via the mass flow controller (MFC) 626. The reaction chamber is adapted to be further supplied with $O_2$ gas from an $O_2$ gas source 630 via a mass flow controller (MFC) 629. Further, the fast ion generating mechanism 623 is adapted to be supplied with Ar gas from an Ar gas source 631.

In the anisotropic etching apparatus described above, when the H(hfac) gas and $O_2$ gas are supplied into the reaction chamber 620, and radiation of the $Ar^+$ ion beam or the Ar atomic beam is directed toward the substrate 22 from the fast ion generating mechanism 623, energy is transferred from $Ar^+$ ions or Ar atoms to H (hfac) gas and $O_2$ gas absorbed in a surface of the substrate or staying in a gas phase in proximity of the surface of the substrate 622, in a similar way to that as shown in FIG. 30. Then, since a relatively active reaction occurs in a bottom portion of a cavity of the Cu wiring layer having higher radiation beam density of $Ar^+$ ions or Ar atoms, in comparison with in a side wall portion of the cavity anisotropic etching is allowed to proceed.

Figure 35:
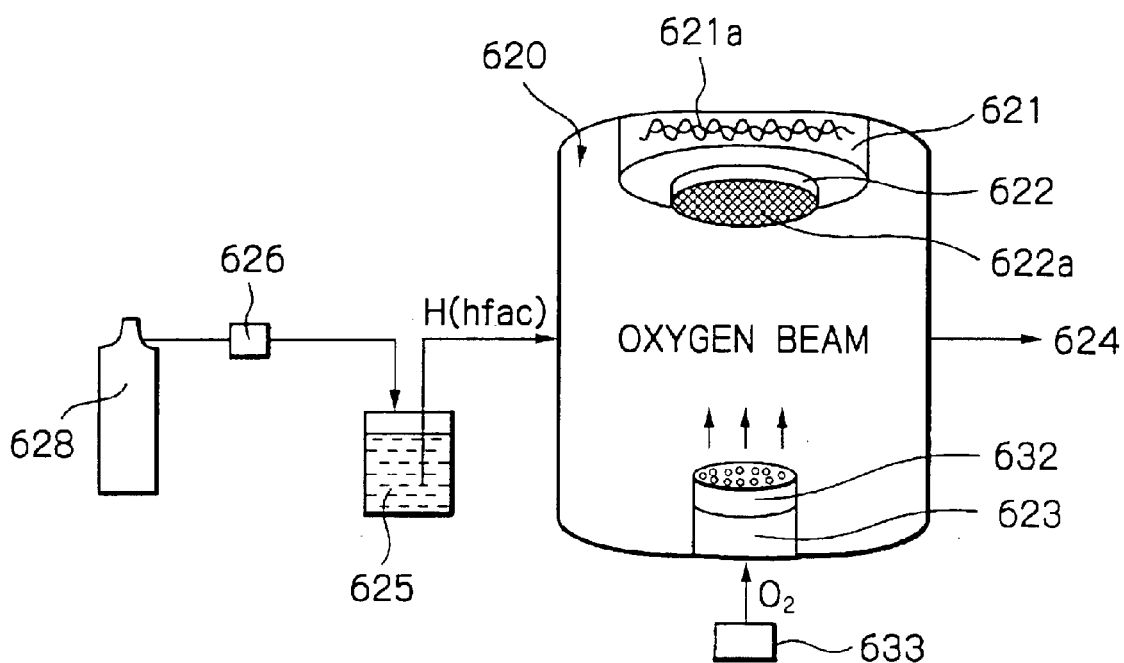
FIG. 35 is a schematic drawing showing another exemplary configuration of a coating apparatus in accordance with the present invention.

FIG. 35 is an exemplary drawing illustrating another conceptual configuration of an anisotropic etching apparatus for performing an anisotropic etching method for a substrate according to the present invention. In FIG. 35, similar parts are designated with the same reference numbers as in FIG. 34. The anisotropic etching apparatus in FIG. 35 is different from that in FIG. 34 in that the former comprises an ion neutralizing mechanism 632 for electrically neutralizing ions arranged in an upper portion of fast ion generating mechanism 623. The fast ion generating mechanism 623 is designed so as to be supplied with $O_2$ gas from an $O_2$ gas source 633. Anisotropic etching in the anisotropic etching apparatus with the above configuration occurs in a similar manner to that as described with reference to FIG. 32.

Figure 36A:
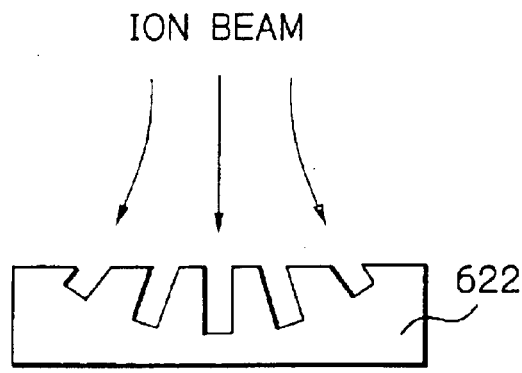
FIG. 36(a) is a schematic cross sectional view showing an undesirable phenomenon which is likely to occur during anisotropic etching in accordance with the present invention when using an ion beam.
Figure 36B:
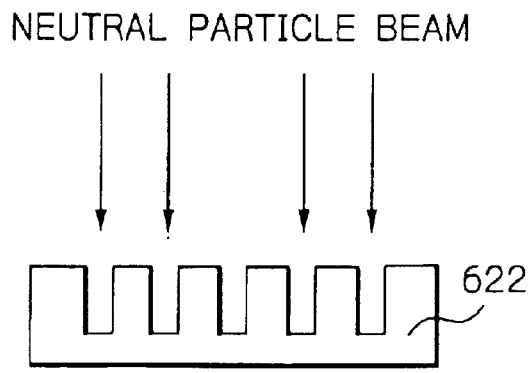
FIG. 36(b) is a schematic cross sectional view showing a condition when anisotropic etching in accordance with the present invention has been preferably performed by using a neutral particle beam.

Employing the ion neutralizing mechanism 632 for electrically neutralizing ions as described above allows the apparatus to have a larger bore. That is, in a case where a charged particle beam, such as an ion beam, is used, since respective particles have homopolar electric charges, the particles tend to repulse one another with a longer beam distance, which has often been true especially for an apparatus with a larger bore. Consequently, a gradient of an etching direction is more likely to increase in an outer periphery of substrate 622, as shown in FIG. 36(*a*). In contrast, using a neutral particle beam generated by neutralizing ions allows irradiated rays to be maintained as directed parallel as shown in FIG. 36(*b*), thereby resolving the above problems and facilitating fabrication of an apparatus with a larger bore. Further, since irradiated particles are electrically neutral, any damage of the substrate 622 possibly caused by excessive charges are avoidable.

Figure 37:
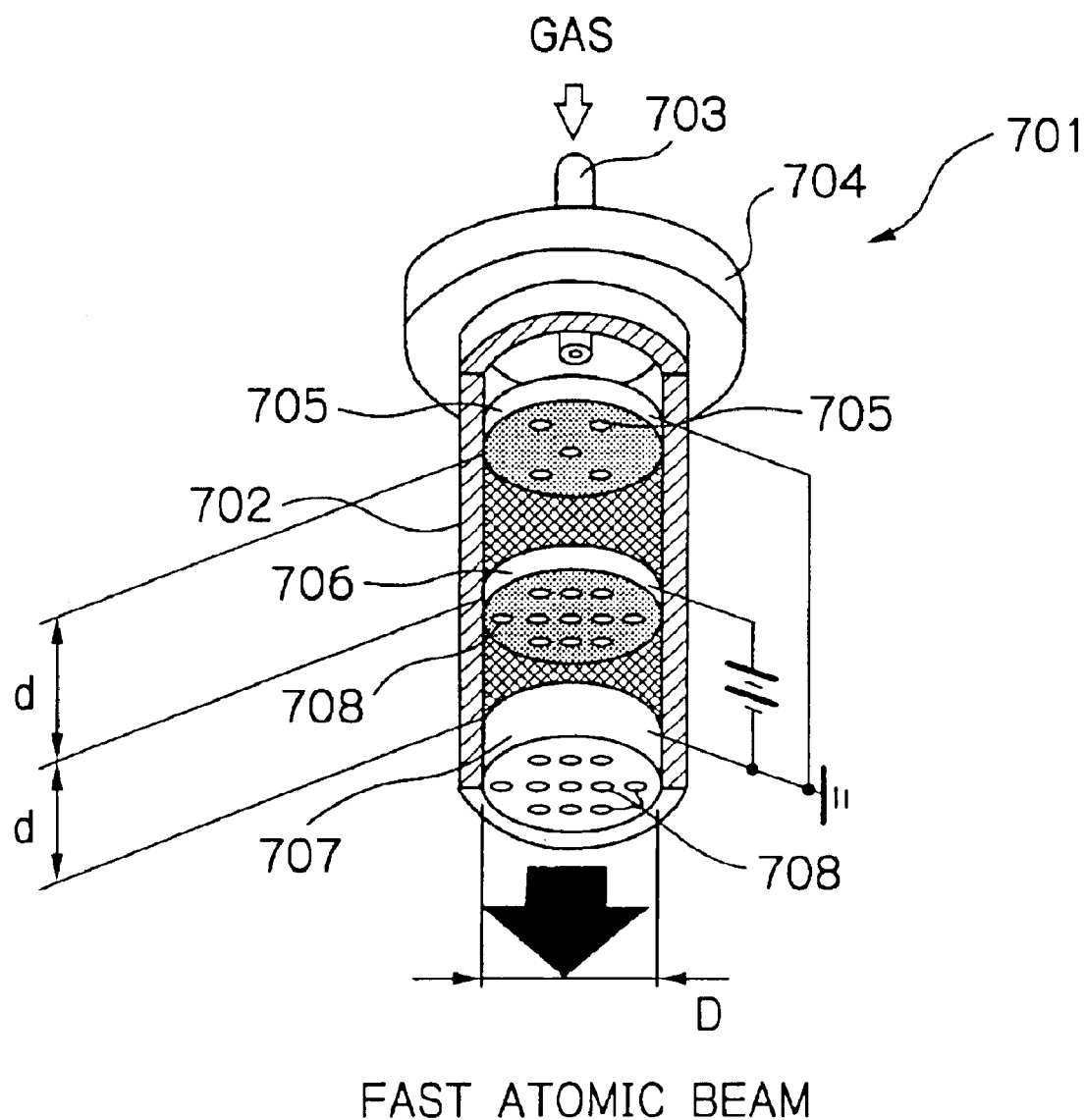
FIG. 37 is a perspective view of a fast particle beam generating apparatus, with a portion of the apparatus being removed for purpose of clarity.

With reference to FIG. 37, there is shown a fast particle beam generating apparatus 701 in accordance with the present invention which is suitable for use in the embodiments of the present invention described above. As shown, the fast particle beam generating apparatus 701 comprises a cylindrical vacuum housing 702 having an upper end closure 704 provided with a source gas intake fitting 703. The housing 702 is provided in its interior with disc-like electrode plates 705, 706 and 707 which are arranged in that order parallel with the upper end closure 704, with the electrode plate 707 being positioned at a lower end of the housing 702. At least one of pairs of neighboring electrode plates, i.e. 705 and 706 or 706 and 707, has a spacing d in a range from 1 mm to 14 mm between the neighboring electrode plates. In other words, the spacing between the neighboring electrode plates is sized to be in the range of D/14–D, wherein "D" is a diameter of the electrode plate. Only for the sake of clarity, in FIG. 37, the spacing d is shown as being generally the same as the diameter D of the electrode plate.

In this embodiment, the electrode plates 705, 706 and 707 are connected to a common high direct current voltage source so that the electrode plates 705 and 707 become cathode plates and the electrode plate 706 positioned between the electrode plates 705 and 707 becomes an anode plate. The electrode plates 705, 706 and 707 are respectively provided with a plurality of holes 708 for allowing gas particles to pass therethrough. As shown, among the electrode plates, the electrode plate 705 has a least number of holes 708 and the electrode plates 706 and 707 have the same number of holes 708.

In the fast particle beam generating apparatus, particle beams are generated in a manner as stated below. A source gas is introduced into the vacuum housing 702 though fitting 703 to fill spaces between the electrode plates 705, 706 and 707. Then, electric discharge is caused between the neighboring electrode plates (705 and 706) and (706 and 707) to generate a plasma or a highly ionized gas. Ionized gas particles are then discharged from the housing through the holes 708 of the electrode plate 707, while being subjected to electrical neutralization when they pass through the holes 708 of the electrode plate 707, whereby a plurality of fast beams of electrically neutral particles are generated.

As stated above, in a conventional fast particle beam generating apparatus, it is common for the electrode plates to be separated at a large distance of about 140 mm. Thus, a great difference in plasma density in the housing thereof is brought about in such a manner that the density becomes maximum at a center of a gap between the electrode plates and gradually decreases towards the electrode plates. Accordingly, it is impossible for the conventional fast particle beam generating apparatus to uniformly discharge particles during its operation. Such a characteristic is not suitable to be used in conducting a precise surface treatment of a semiconductor substrate including coating and etching as explained in connection with the embodiments described above.

In contrast, the fast particle beam generating apparatus in accordance with the present invention comprises at least one pair of parallel electrode plates for subjecting gas introduced therebetween to an electric discharge to generate a plasma, with a distance between the electrode plates being small, i.e., in the range from D/14 to D, wherein "D" is a diameter of the electrode plate, specifically, in a range from 1 mm–14 mm. Consequently, a plasma density difference as discussed above decreases to enable the particle beams to be uniformly discharged from the particle beam generating apparatus. This enables the apparatus to be preferably used in conducting a precise surface treatment of a semiconductor substrate.

A reason why the distance between the adjacent electrode plates should be set in the range from 1 mm to 14 mm will be explained below.

Figure 38:
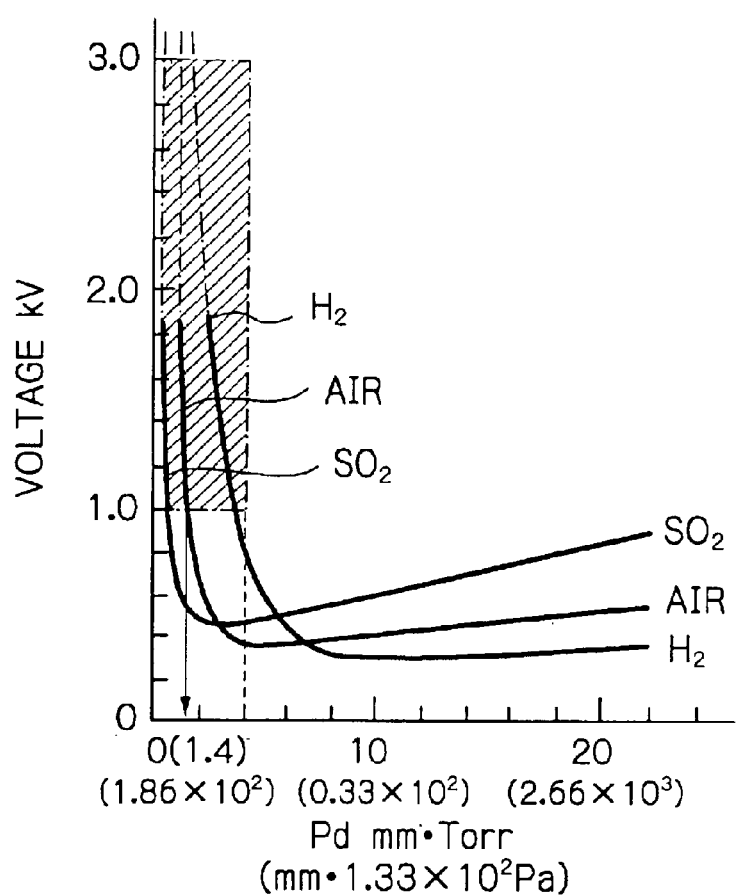
FIG. 38 is a diagram showing a relationship between a product of gas pressure and distance between electrode plates and a voltage necessary for initiation of plasma discharge.

According to Paschen's Law, a direct current voltage V for triggering an electric discharge is decided by P×d, in which "P" is a gas pressure and "d" is a distance between adjacent electrode plates. FIG. 38 shows relationships between "P×d" and particular gases, i.e., sulfur dioxide, air, and hydrogen. In a conventional fast particle beam generating apparatus, voltage "V" is set generally to 1–3 kVDC and "Pd" is set in the range of about 0.4–1.5 mm·Torr (about 53.2–186.2 mm·Pa) depending on a kind of gas. Accordingly, assuming that conventional operation conditions are V=1 kV, d=140 mm and P=1.33 Pa, Pd becomes 186.2 mm·Pa and, thus, an electric discharge initiation characteristic is generally represented by a curve of air in FIG. 38.

As shown in FIG. 38, in the case of "air", "Pd" corresponding to an electric discharge initiation voltage at 1 kV is 186.2 mm·Pa, if "D" is 14 mm in this embodiment, "P" becomes 13.3 (186.2/14) Pa which is ten times as much as conventional gas pressure. As gas pressure increases, plasma density increases accordingly, thereby enabling a surface of a semiconductor substrate to be treated at a high speed. Namely, by decreasing distance d between adjacent electrode plates, plasma is improved in its density and uniformity to thereby allow the fast particle beam generation apparatus to be appropriately used in conducting surface treatment of a semiconductor substrate.

Figure 39:
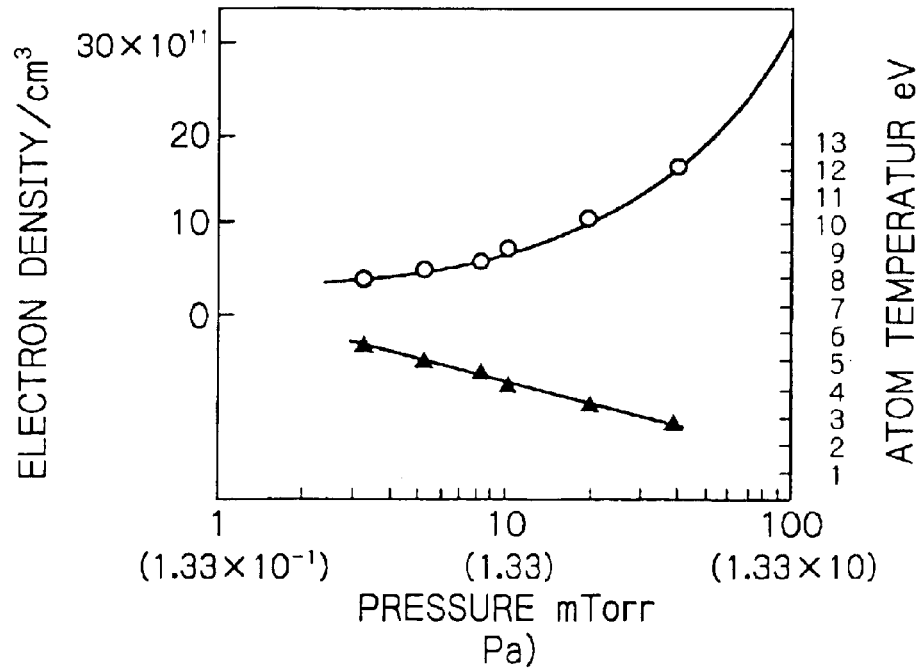
FIG. 39 is a diagram showing a relationship between plasma density and electron density in a plasma.

As discussed above, in order to treat a substrate at a high speed, it is necessary for the fast particle beam generating apparatus to have a high ion density, or to generate a high plasma density of, for example, $10^{11}$–$10^{12}$/cm$^3$. A plasma density generated by a conventional glow discharge is around $10^{10}$/cm$^3$ which is about 1–10% of a necessary density. FIG. 39 shows relationships between an electron density and a gas pressure during a plasma discharge. As shown, as the gas pressure increases ten times from 1.33 Pa to 13.3 Pa, the electron density increases about five times from $7\times10^{11}$/cm$^3$ to $3.3\times10^{12}$/cm$^3$. It is thus noted that as the gas pressure increases ten times, the electron density increases about five time.

Assuming that electron density and plasma density correspond to each other, by increasing gas pressure ten times from 1.33 Pa to 13.3 Pa, the plasma density increases from $10^{10}$/cm$^3$, which is obtained in a conventional apparatus, to $10^{11}$–$10^{12}$/cm$^3$. Namely, in order to set the distance between the adjacent electrode plates "d" to be in the range of 1 mm–14 mm, it is necessary to increase gas pressure ten times, thereby obtaining a high plasma density or high density and high speed ions.

It is advantageous that, when a plurality of gasses are used for surface treatment of a semiconductor substrate, Penning ionization is employed in which metastable excited particles collide with neutral particles to ionize the neutral particles. In order to cause one or more collision between metastable excited particles and neutral particles in vacuum housing 702, it is necessary for the distance "d" between the adjacent electrode plates to be larger than a mean free path of particles in the vacuum housing 702. That is, the following must be satisfied:

$$d > \lambda \quad (1)$$

Generally, the following relation stands between gas pressure P (Pa) and free path $\lambda$:

$$\lambda \approx 1.33/P \quad (2)$$

Assuming that the gas pressure P is 13.3 Pa, from (1) and (2) above, the following is derived:

$$d > 1.33/13.3 = 1\times10^{-1} \text{ cm } d > 1 \text{ mm}.$$

From the forgoing, it is decided that, by setting the distance between the adjacent electrode plates "d" to be in the range from 1 mm to 14 mm, a uniform plasma density can be obtained so that the fast particle beam generating apparatus can be used in conducting a surface treatment of a semiconductor substrate in a uniform and high speed operational manner.

Although, at present, a diameter of most semiconductor wafers is 200 mm, it is expected that semiconductor wafers of 300 mm in diameter will be used for production of a part of semiconductor devices. The present invention can apply to treatment of such a large diameter wafer. Namely, the present invention can apply to treatment of such a large size of semiconductor substrate by employing electrode plates that are 300 mm in diameter, provided that maintaining the distance between adjacent electrode plates is in the range of D/14–D.

It should be noted that the present invention can apply to semiconductor substrates of any diameter sizes.

Further, it is preferable that fast particle beams are subject to a so-called "choke effect" when they pass holes 708 of the electrode plate 707 to exit the vacuum housing 702 so that circumstances relating to the beams inside the housing is independent from those outside the housing. This enables the interior of the housing 702 to be stable regardless of any changes in circumstances outside the housing 702, which might be caused at a surface of a substrate to be treated. Further, a space downstream of the fast particle beam generating apparatus may be used as an intermediate flow or molecular flow zone in which a substrate is placed to be subjected to anisotropic etching, modification, or coating.

Figure 40:
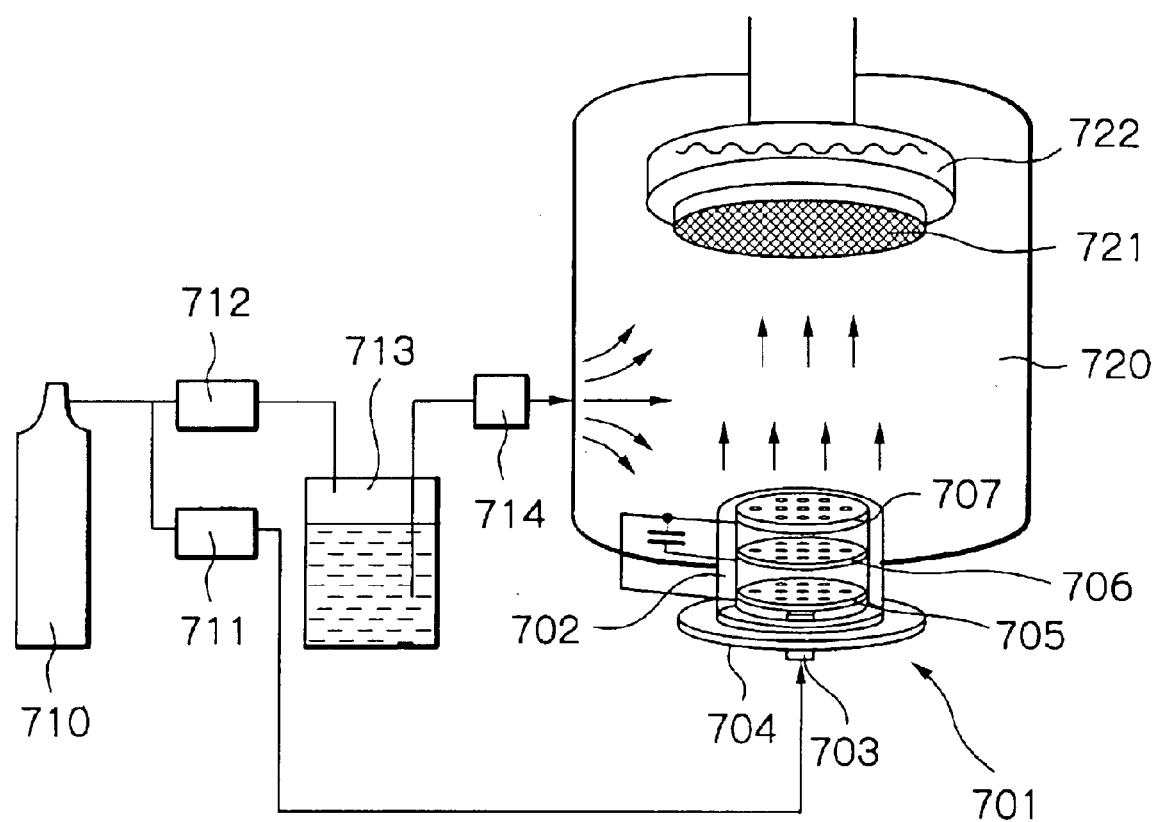
FIG. 40 is a schematic drawing showing an exemplary configuration of a coating apparatus in accordance with the present invention.

With reference to FIG. 40, there is shown a surface treatment (or coating) apparatus which is substantially the same as the coating apparatus explained with reference to FIG. 9 except that the apparatus of FIG. 40 employs a fast particle beam generating apparatus as shown in FIG. 37 in place of the beam generating device denoted by reference numeral 28 in FIG. 9. The surface treatment apparatus of FIG. 40 includes a reactor housing 720 provided with fast particle beam generating apparatus 701 at a bottom thereof. At a top of the reactor housing, there is provided a substrate susceptor 722, having heating and cooling functions, which holds a substrate 721 in such a manner that a surface thereof to be subjected to a treatment faces the fast particle beam generating apparatus 701. The reactor housing is further provided with a vacuum evacuation system (not shown) for generating a vacuum in the reactor housing.

Furthermore, the surface treatment apparatus of FIG. 40 includes a gas supply device comprising a hydrogen gas container 710. Hydrogen gas is introduced into the gas particle beam generating apparatus 701 through a flow regulator 711 and gas intake fitting 703 of the fast particle beam generator.

Hydrogen gas is also supplied to a reservoir 713 of an organic complex source liquid or hexafluoroacetylacetunate-Cu(I)-trimethylvinylsilance. The source liquid is evaporated by an evaporator 714 and supplied into the reactor housing 720.

In this surface treatment apparatus, coating of copper is conducted as follows. The source liquid of hexafluoroacetylacetunate-Cu(I)-trimethylvinylsilance evaporated by the evaporator 714 is supplied into the reactor housing 720 which has been decompressed. Simultaneously, hydrogen in the container 710 is supplied into vacuum housing 702 of the fast particle beam generating apparatus 701. The hydrogen introduced into the vacuum housing is subject to a plasma discharge in such a manner as stated above. Ions generated by the plasma discharge fly into the reactor housing 720 through holes 708 of electrode plate 707 of the fast particle beam generating apparatus while being subjected to electrical neutralization thereof when they pass through the holes 708 of the electrode plate 707, whereby neutral fast atom beams are formed. The beams irradiate the source material i.e., hexafluoroacetylacetunate-Cu(I)-trimethylvinylsilance adsorbed on a surface of substrate 721 to facilitate deposition of copper over the surface of the substrate 721.

It will be clear that the fast particle beam generating apparatus 701 is applicable to the various embodiments of the present invention described above so as to facilitate utilization of irradiation of a fast particle beam to a surface of a substrate to enhance various advantageous effects which are inherently brought about via the embodiments.

It should be noted that the present invention is not limited to the forgoing embodiments but can be modified in a variety of ways.

What is claimed is:

1. A method of performing a surface treatment on a surface of a substrate, the surface treatment being selected from the group consisting of coating, denaturation, modification and etching, said method comprising:

bringing a surface treatment gas into contact with a surface of a substrate; and while bringing said surface treatment gas into contact with said surface of said substrate, irradiating said surface of said substrate with a fast particle beam, other than an electron beam and a neutral beam, to enhance activity of said surface and/or said surface treatment gas so as to facilitate a reaction between said surface and said surface treatment gas.

2. The method according to claim 1, wherein irradiating said surface of said substrate with a fast particle beam comprises irradiating said surface of said substrate with a particle beam selected from the group consisting of a charged particle beam, an atomic beam and a molecular beam.

3. The method according to claim 2, wherein the surface treatment is coating of said surface of said substrate, and wherein irradiating said surface of said substrate with a particle beam selected from the group consisting of a charged particle beam, an atomic beam and a molecular beam comprises irradiating a portion of said surface of said substrate with said particle beam selected from the group consisting of said charged particle beam, said atomic beam and said molecular beam prior to, simultaneously with, and/or subsequent to bringing said surface treatment gas into contact with said surface of said substrate, such that bringing said surface treatment gas into contact with said surface of said substrate and irradiating said portion of said surface of said substrate with said particle beam results in component elements of said surface treatment gas being chemically deposited onto said surface of said substrate.

4. The method according to claim 1, wherein the surface treatment is coating of said surface of said substrate, with said substrate including an interlayer insulative film layer as a top layer, wherein bringing a surface treatment gas into contact with a surface of a substrate comprises bringing into contact with a surface of said interlayer insulative film layer a surface treatment gas including component elements such that a diffusion barrier layer is formed in contact with said interlayer insulative film layer, and irradiating said surface of said substrate with a fast particle beam comprises irradiating said diffusion barrier layer with said fast particle beam so as to form a strongly combined layer resulting from mixed atoms or molecules of said interlayer insulative film layer and said diffusion barrier layer.

5. The method according to claim 4, wherein said interlayer insulative film layer comprises a material consisting essentially of an organic material having a low dielectric constant, and wherein bringing said surface treatment gas into contact with said surface of said interlayer insulative film layer such that a diffusion barrier layer is formed comprises bringing said surface treatment gas into contact with said surface of said interlayer insulative film layer such that formed is a diffusion barrier layer of metal or a compound.

6. The method according to claim 1, wherein the surface treatment is anisotropic dry etching of said substrate, and wherein bringing a surface treatment gas into contact with a surface of a substrate comprises bringing into contact with said surface of said substrate a gas that reacts well with material of said substrate such that a chemical reaction between said material of said substrate and said gas results in a compound being formed, which compound includes a component element of said material of said substrate, whereby said material of said substrate is removed from said surface of said substrate, and irradiating said surface of said substrate with a fast particle beam comprises irradiating said surface of said substrate with a collimated beam so as to increase a rate of removal of said material of said substrate along a direction in which said collimated beam is directed toward said surface of said substrate.

7. The method according to claim 6, wherein irradiating said surface of said substrate with a collimated beam comprises irradiating said surface of said substrate with a collimated beam having particle energy in a range of from 200 eV to 10 keV.

8. The method according to claim 1, further comprising:

generating said fast particle beam from a gas that is different from said surface treatment gas.

9. The method according to claim 8, wherein bringing a surface treatment gas into contact with a surface of a substrate comprises bringing a non-ionized surface treatment gas into contact with said surface of said substrate.

10. The method according to claim 9, wherein irradiating said surface of said substrate with a fast particle beam comprises irradiating said surface of said substrate with a particle beam selected from the group consisting of a charged particle beam, an atomic beam and a molecular beam.

11. The method according to claim 10, wherein the surface treatment is coating of said surface of said substrate, and wherein irradiating said surface of said substrate with a particle beam selected from the group consisting of a charged particle beam, an atomic beam and a molecular beam comprises irradiating a portion of said surface of said substrate with said particle beam selected from the group consisting of said charged particle beam, said atomic beam and said molecular beam prior to, simultaneously with, and/or subsequent to bringing said surface treatment gas into contact with said surface of said substrate, such that bringing said surface treatment gas into contact with said surface of said substrate and irradiating said portion of said surface of said substrate with said particle beam results in component elements of said surface treatment gas being chemically deposited onto said surface of said substrate.

12. The method according to claim 9, wherein the surface treatment is anisotropic dry etching of said substrate, and wherein bringing a surface treatment gas into contact with a surface of a substrate comprises bringing into contact with said surface of said substrate a gas that reacts well with material of said substrate such that a chemical reaction between said material of said substrate and said gas results in a compound being formed, which compound includes a component element of said material of said substrate, whereby said material of said substrate is removed from said surface of said substrate, and irradiating said surface of said substrate with a fast particle beam comprises irradiating said surface of said substrate with a collimated beam so as to increase a rate of removal of said material of said substrate along a direction in which said collimated beam is directed toward said surface of said substrate.

13. The method according to claim 12, wherein irradiating said surface of said substrate with a collimated beam comprises irradiating said surface of said substrate with a collimated beam having particle energy in a range of from 200 eV to 10 keV.

14. A method of etching a surface of a substrate, comprising:

bringing into contact with a surface of a substrate a gas that reacts well with material of said substrate such that a chemical reaction between said material of said substrate and said gas results in a compound being formed, which compound includes a component element of said material of said substrate, whereby said material of said substrate is removed from said surface of said substrate, and irradiating said surface of said substrate with an ultraviolet light beam or a laser beam to enhance activity of said surface and/or said gas and thereby increase a rate of removal of said material of said substrate along a direction in which said ultraviolet light beam or said laser beam is directed toward said surface of said substrate.

15. The method according to claim 14, wherein neither said ultraviolet light beam nor said laser beam is formed from said gas.

16. A method of coating a surface of a silicon substrate for fabricating a semiconductor device, with said silicon substrate being provided on said surface with an interconnect pattern recess, said method comprising:

bringing an organic complex gas containing copper as a component element thereof into contact with said surface of said silicon substrate; and prior to, simultaneously with, and/or subsequent to bringing said organic complex gas into contact with said surface of said silicon substrate, irradiating a portion of said surface of said silicon substrate with a fast particle beam selected from the group consisting of a charged particle beam, an atomic beam and a molecular beam to enhance activity of said surface and/or said organic complex gas so as to facilitate a reaction between said surface and said organic complex gas, such that bringing said organic complex gas into contact with said surface of said silicon substrate and irradiating said portion of said surface of said silicon substrate with said fast particle beam results in the copper of said organic complex gas being chemically deposited onto said surface of said silicon substrate.

17. The method according to claim 16, wherein irradiating a portion of said surface of said silicon substrate with said fast particle beam comprises irradiating said portion of said surface of said silicon substrate with a particle beam having a particle energy in a range of from 200 eV to 10 keV.

18. A method of coating a surface of a substrate, said substrate including an interlayer insulative film layer as a top layer, and said interlayer insulative film layer defining an interconnect or circuit wiring pattern recess, said method comprising:

bringing a surface treatment gas including component elements into contact with a surface of said interlayer insulative film layer such that a diffusion barrier layer is formed in contact with said interlayer insulative film layer and over a surface of said interconnect or circuit wiring pattern recess so as to define another recess that corresponds to said interconnect or circuit wiring pattern recess;

irradiating said diffusion barrier layer with a fast particle beam, other than an electron beam, to enhance activity of said surface of said interlayer insulative film layer and/or said surface treatment gas so as to facilitate a reaction between said surface and said surface treatment gas and form a strongly combined layer resulting from mixed atoms or molecules of said interlayer insulative film layer and said diffusion barrier layer; and filling said another recess to form an interconnect of a semiconductor device.

19. The method according to claim 18, wherein irradiating said diffusion barrier layer with said fast particle beam comprises irradiating said diffusion barrier layer with a particle beam having particle energy in a range of from 200 eV to 10 keV.

20. A method of coating a surface of a substrate, said surface including a recess, said method comprising:

bringing a surface treatment gas into contact with said surface of said substrate;

irradiating said surface of said substrate with a fast particle beam, other than an electron beam, to enhance activity of said surface and/or said surface treatment gas so as to facilitate a reaction between said surface and said surface treatment gas; and while irradiating said surface of said substrate with said fast particle beam, changing an angle of said surface relative to said fast particle beam so as to change an angle at which said fast particle beam impinges said surface, whereby said surface in its entirety, including a surface portion defining said recess, is irradiated with said fast particle beam.

21. The method according to claim 20, wherein irradiating said surface of said substrate with said fast particle beam comprises irradiating said surface of said substrate with a collimated beam.

22. The method according to claim 20, wherein bringing said surface treatment gas into contact with said surface of said substrate and irradiating said surface of said substrate with said fast particle beam results in a coating layer being formed in said recess, with dimensions of said coating layer changing during said surface treatment gas being brought into contact with said surface of said substrate and the irradiation of said surface with said fast particle beam such that a depth and a width of said recess also change during said surface treatment gas being brought into contact with said surface of said substrate and the irradiation of said surface with said fast particle beam, and an aspect ratio, defined by the depth of said recess divided by the width of said recess, remains constant during said surface treatment gas being brought into contact with said surface of said substrate and the irradiation of said surface with said fast particle beam until said coating layer completely fills said recess.

23. A method of coating a surface of a silicon substrate for fabricating a semiconductor device, said silicon substrate being provided on a surface thereof with an interconnect pattern recess, said method comprising:

bringing a non-ionized organic complex gas containing copper as a component element thereof into contact with said surface of said silicon substrate;

generating a fast particle beam, selected from the group consisting of a charged particle beam, an atomic beam and a molecular beam, from a gas that is different from said non-ionized organic complex gas; and prior to, simultaneously with, and/or subsequent to bringing said non-ionized organic complex gas into contact with said surface of said silicon substrate, irradiating a portion of said surface of said silicon substrate with said fast particle beam to enhance activity of said surface and/or said nonionized organic complex gas so as to facilitate a reaction between said surface and said non-ionized organic complex gas, such that bringing said non-ionized organic complex gas into contact with said surface of said silicon substrate and irradiating said portion of said surface of said silicon substrate with said fast particle beam results in the copper of said non-ionized organic complex gas being chemically deposited onto said surface of said silicon substrate.

24. A method of etching a surface of a substrate, comprising:

bringing into contact with a surface of a substrate a non-ionized gas that reacts well with material of said substrate such that a chemical reaction between said material of said substrate and said non-ionized gas results in a compound being formed, which compound includes a component element of said material of said substrate, whereby said material of said substrate is removed from said surface of said substrate, and irradiating said surface of said substrate with an ultraviolet light beam or a laser beam to enhance activity of said surface and/or said non-ionized gas and thereby increase a rate of removal of said material of said substrate along a direction in which said ultraviolet light beam or said laser beam is directed toward said surface of said substrate, wherein neither said ultraviolet light beam nor said laser beam is formed from said non-ionized gas.

* * * * *